United States Patent
Tanabe et al.

(10) Patent No.: US 10,749,522 B2
(45) Date of Patent: Aug. 18, 2020

(54) ELECTRIC POWER CONVERSION APPARATUS

(71) Applicant: DENSO CORPORATION, Kariya, Aichi-pref. (JP)

(72) Inventors: Ryota Tanabe, Kariya (JP); Kazuya Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 404 days.

(21) Appl. No.: 15/784,825

(22) Filed: Oct. 16, 2017

(65) Prior Publication Data

US 2018/0109253 A1    Apr. 19, 2018

(30) Foreign Application Priority Data

Oct. 17, 2016  (JP) ................. 2016-203789

(51) Int. Cl.
| | |
|---|---|
| *B60L 3/00* | (2019.01) |
| *H03K 17/66* | (2006.01) |
| *H02M 7/00* | (2006.01) |
| *H01L 25/11* | (2006.01) |

(Continued)

(52) U.S. Cl.
CPC ............ *H03K 17/665* (2013.01); *B60L 3/003* (2013.01); *H02M 7/003* (2013.01); *B60L 2210/40* (2013.01); *H01G 4/236* (2013.01); *H01L 23/642* (2013.01); *H01L 25/115* (2013.01); *H01L 25/117* (2013.01); *Y02T 10/7022* (2013.01)

(58) Field of Classification Search
CPC .... B60L 3/003; B60L 2210/40; H02M 7/003; H03K 17/665; H01G 4/236; H01L 23/642; H01L 25/115; H01L 25/117; Y02T 10/7022

USPC ......................................................... 307/147
See application file for complete search history.

(56) References Cited

U.S. PATENT DOCUMENTS

| | | | | |
|---|---|---|---|---|
| 3,857,074 A | * | 12/1974 | Heywang ............... | H01G 4/228 361/307 |
| 2007/0109715 A1 | * | 5/2007 | Azuma .................. | B60L 50/16 361/299.3 |

(Continued)

FOREIGN PATENT DOCUMENTS

| | | |
|---|---|---|
| JP | 2006-295997 A | 10/2006 |
| JP | 2015-139299 A | 7/2015 |

*Primary Examiner* — Rexford N Barnie
*Assistant Examiner* — Brian K Baxter
(74) *Attorney, Agent, or Firm* — Oliff PLC

(57) ABSTRACT

An electric power conversion apparatus includes at least one semiconductor module, a capacitor, a pair of positive and negative busbars and an insulator. The positive busbar includes a positive busbar base protruding from the capacitor in a Y direction and at least one positive busbar terminal extending perpendicular to an X direction. The negative busbar includes a negative busbar base protruding from the capacitor in the Y direction and at least one negative busbar terminal extending perpendicular to the X direction. The positive and negative busbar bases are arranged to have their major surfaces facing each other in a Z direction. The positive and negative busbar terminals at least partially overlap each other in the X direction with the insulator interposed therebetween. The at least one semiconductor module has a pair of positive and negative power terminals connected respectively to the positive and negative busbar terminals.

9 Claims, 29 Drawing Sheets

(51) Int. Cl.
 *H01L 23/64* (2006.01)
 *H01G 4/236* (2006.01)

(56) References Cited

U.S. PATENT DOCUMENTS

| | | | |
|---|---|---|---|
| 2010/0117570 A1* | 5/2010 | Nishimori | H02M 7/003 318/400.3 |
| 2010/0259898 A1* | 10/2010 | Kimura | H05K 7/209 361/704 |
| 2010/0327949 A1* | 12/2010 | Gotou | H01L 25/115 327/487 |
| 2011/0261600 A1* | 10/2011 | Tachibana | H02M 7/003 363/131 |
| 2011/0304948 A1* | 12/2011 | Lee | H01G 9/155 361/301.1 |
| 2013/0021749 A1* | 1/2013 | Nakajima | H02M 7/003 361/689 |
| 2013/0094269 A1* | 4/2013 | Maeda | H01L 24/36 363/141 |
| 2014/0085955 A1* | 3/2014 | Maeda | H02M 7/003 363/132 |
| 2014/0153189 A1* | 6/2014 | Okamura | H05K 1/0213 361/688 |
| 2014/0185266 A1* | 7/2014 | Iwata | H02M 7/003 361/820 |
| 2014/0284765 A1* | 9/2014 | Kiuchi | H01L 28/40 257/532 |
| 2014/0355221 A1* | 12/2014 | Sawada | H05K 7/1432 361/735 |
| 2015/0049533 A1 | 2/2015 | Nishikimi et al. | |
| 2015/0222196 A1* | 8/2015 | Tokuyama | H01L 23/36 363/131 |
| 2015/0256096 A1* | 9/2015 | Nishizawa | H01G 2/04 363/131 |
| 2016/0268782 A1* | 9/2016 | Fujita | H02B 1/20 |

\* cited by examiner

FIG.6
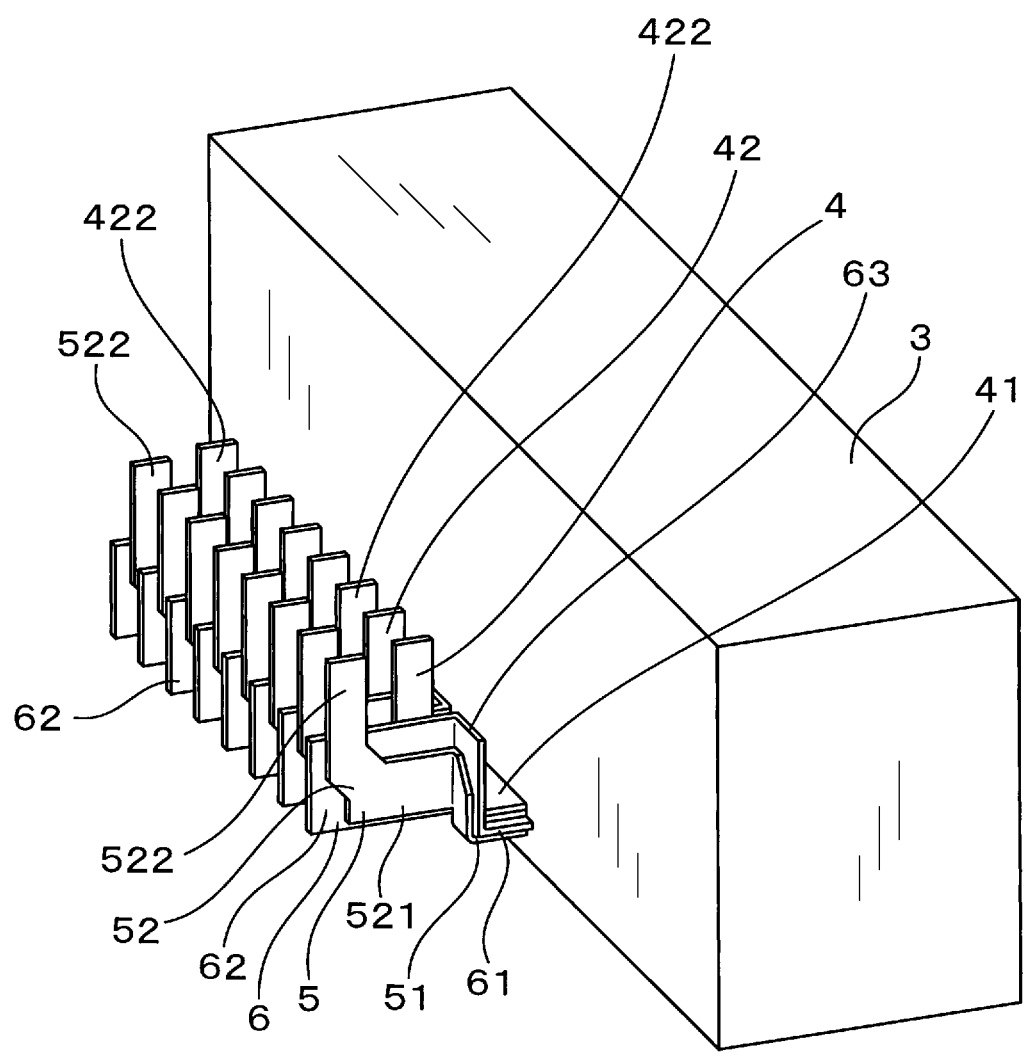
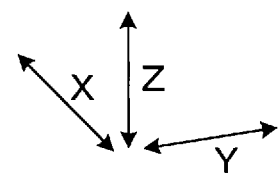

ELECTRIC POWER CONVERSION APPARATUS

CROSS-REFERENCE TO RELATED APPLICATION

This application is based on and claims priority from Japanese Patent Application No. 2016-203789 filed on Oct. 17, 2016, the content of which is hereby incorporated by reference in its entirety into this application.

BACKGROUND

1. Technical Field

The present invention relates to electric power conversion apparatuses that include a main circuit unit having a plurality of semiconductor modules arranged in a stacked manner, a capacitor, and positive and negative busbars electrically connecting the semiconductor modules to the capacitor.

2. Description of Related Art

There is disclosed an electric power conversion apparatus in, for example, Japanese Patent Application Publication No. JP2013169070A. The electric power conversion apparatus includes a main circuit unit having a plurality of semiconductor modules arranged in a stacked manner, a capacitor, and positive and negative busbars electrically connecting the semiconductor modules to the capacitor.

Specifically, in the electric power conversion apparatus, the positive and negative busbars are electrically connected respectively to a pair of electrodes of the capacitor. Moreover, the positive busbar includes a plurality of positive busbar terminals that are electrically connected respectively to positive power terminals of the semiconductor modules. On the other hand, the negative busbar includes a plurality of negative busbar terminals that are electrically connected respectively to negative power terminals of the semiconductor modules.

However, the inventors of the present application have found that the above electric power conversion apparatus involves the following problem.

In the electric power conversion apparatus, the positive busbar terminals are arranged alternately with the negative busbar terminals in a row in a stacking direction of the semiconductor modules. Therefore, it is necessary to secure sufficient intervals between these alternately arranged positive and negative busbar terminals. Consequently, it is difficult to minimize the size (or dimension) of the electric power conversion apparatus in the arrangement direction of the positive and negative busbar terminals, i.e., in the stacking direction of the semiconductor modules.

SUMMARY

According to exemplary embodiments, there is provided an electric power conversion apparatus which includes at least one semiconductor module having a positive power terminal and a negative power terminal, a capacitor, a pair of positive and negative busbars provided to electrically connect the at least one semiconductor module to the capacitor, and an insulator provided to electrically insulate the positive and negative busbars from each other. The positive busbar includes a positive busbar base and at least one positive busbar terminal. The positive busbar base protrudes from the capacitor in a busbar base protruding direction and extends in a busbar base extending direction that is perpendicular to the busbar base protruding direction. The at least one positive busbar terminal extends perpendicular to the busbar base extending direction. The negative busbar includes a negative busbar base and at least one negative busbar terminal. The negative busbar base protrudes from the capacitor in the busbar base protruding direction and extends in the busbar base extending direction. The at least one negative busbar terminal extends perpendicular to the busbar base extending direction. The positive busbar base and the negative busbar base are arranged to have their major surfaces facing each other in a busbar base facing direction. The busbar base facing direction is perpendicular to both the busbar base protruding direction and the busbar base extending direction. The at least one positive busbar terminal and the at least one negative busbar terminal at least partially overlap each other in the busbar base extending direction with the insulator interposed therebetween. The positive power terminal of the at least one semiconductor module is connected to the at least one positive busbar terminal, and the negative power terminal of the at least one semiconductor module is connected to the at least one negative busbar terminal.

With the above configuration, it is possible to reduce the interval(s) between the at least one positive busbar terminal and the at least one negative busbar terminal in the busbar base extending direction while ensuring electrical insulation therebetween. Consequently, it becomes possible to minimize the size (or dimension) of the electric power conversion apparatus in the busbar base extending direction.

Moreover, with the at least one positive busbar terminal and the at least one negative busbar terminal at least partially overlapping each other with the insulator interposed therebetween, it becomes possible to lower the inductance at the positive and negative busbars.

BRIEF DESCRIPTION OF THE DRAWINGS

The present invention will be understood more fully from the detailed description given hereinafter and from the accompanying drawings of exemplary embodiments, which, however, should not be taken to limit the present invention to the specific embodiments but are for the purpose of explanation and understanding only.

In the accompanying drawings:

FIG. 6 is a perspective view, from the front right side, of the capacitor and the positive and negative busbars of the electric power conversion apparatus according to the first embodiment;

DESCRIPTION OF EMBODIMENTS

Figure 1:
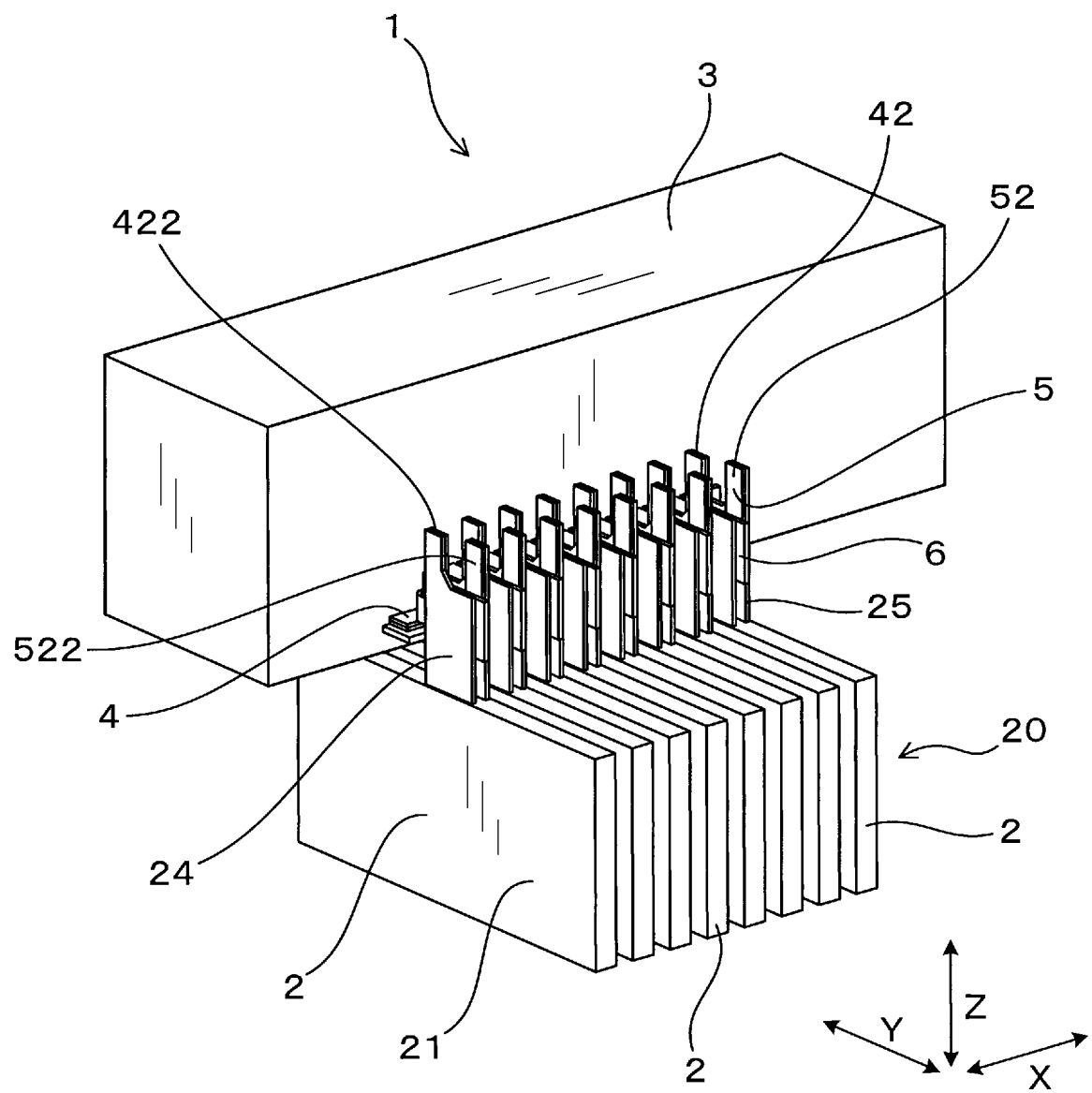
FIG. 1 is a perspective view of an electric power conversion apparatus according to a first embodiment.

Exemplary embodiments will be described hereinafter with reference to FIGS. 1-33. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

As shown in FIGS. 1-4, an electric power conversion apparatus 1 according to a first embodiment includes a main circuit unit 20, a capacitor 3, a positive busbar 4 and a negative busbar 5.

The main circuit unit 20 has a plurality of semiconductor modules 2 arranged in a stacked manner. The capacitor 3 is electrically connected with the semiconductor modules 2. The positive and negative busbars 4 and 5 electrically connect the semiconductor modules 2 to the capacitor 3.

As shown in FIGS. 5-10, the positive busbar 4 includes a positive busbar base 41 and a plurality of positive busbar terminals 42. The positive busbar base 41 protrudes from the capacitor 3 in a busbar base protruding direction Y and extends in a stacking direction X of the semiconductor modules 2 (or in a busbar base extending direction X); the busbar base protruding direction Y is perpendicular to the stacking direction X. The positive busbar terminals 42 each extend perpendicular to the stacking direction X and are spaced from one another in the stacking direction X.

Similarly, the negative busbar 5 includes a negative busbar base 51 and a plurality of negative busbar terminals 52. The negative busbar base 51 protrudes from the capacitor 3 in the busbar base protruding direction Y and extends in the stacking direction X of the semiconductor modules 2. The negative busbar terminals 52 each extend perpendicular to the stacking direction X and are spaced from one another in the stacking direction X.

The positive busbar base 41 and the negative busbar base 51 are arranged to have their major surfaces facing each other in a busbar base facing direction Z; the busbar base facing direction Z is perpendicular to both the stacking direction X and the busbar base protruding direction Y. The positive busbar terminals 42 are arranged alternately with the negative busbar terminals 52 in the stacking direction X.

Hereinafter, the stacking direction X will be simply referred to as "X direction"; the busbar base protruding direction Y will be simply referred to as "Y direction"; and the busbar base facing direction Z will be simply referred to as "Z direction".

Moreover, hereinafter, for the sake of convenience of explanation, in the Y direction, the side toward which both the positive busbar base 41 and the negative busbar base 51 protrude from the capacitor 3 will be referred to as "front side"; the opposite side to "front side" will be referred to as "rear side". In addition, it should be noted that unless specified otherwise, the expressions "front side" and "rear side" used hereinafter are irrelevant to, for example, the horizontally front and rear sides of a vehicle where the electric power conversion apparatus 1 is mounted and used.

Figure 11:
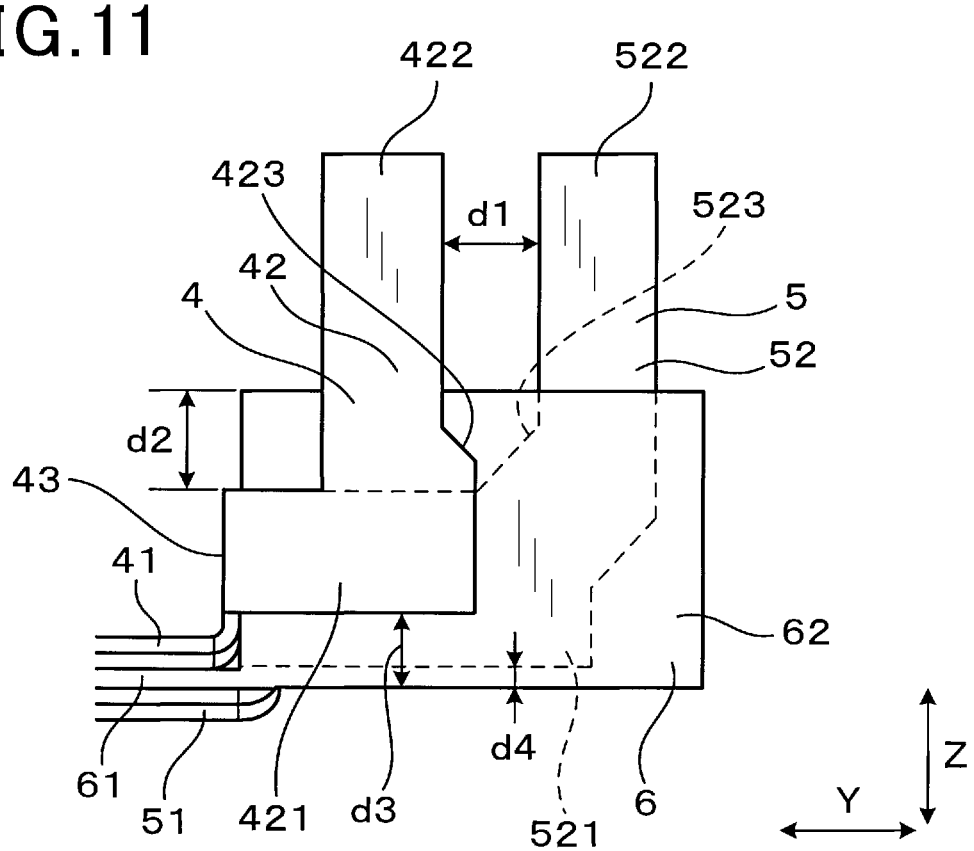
FIG. 11 is a side view along the arrow XI in FIG. 9.
Figure 12:
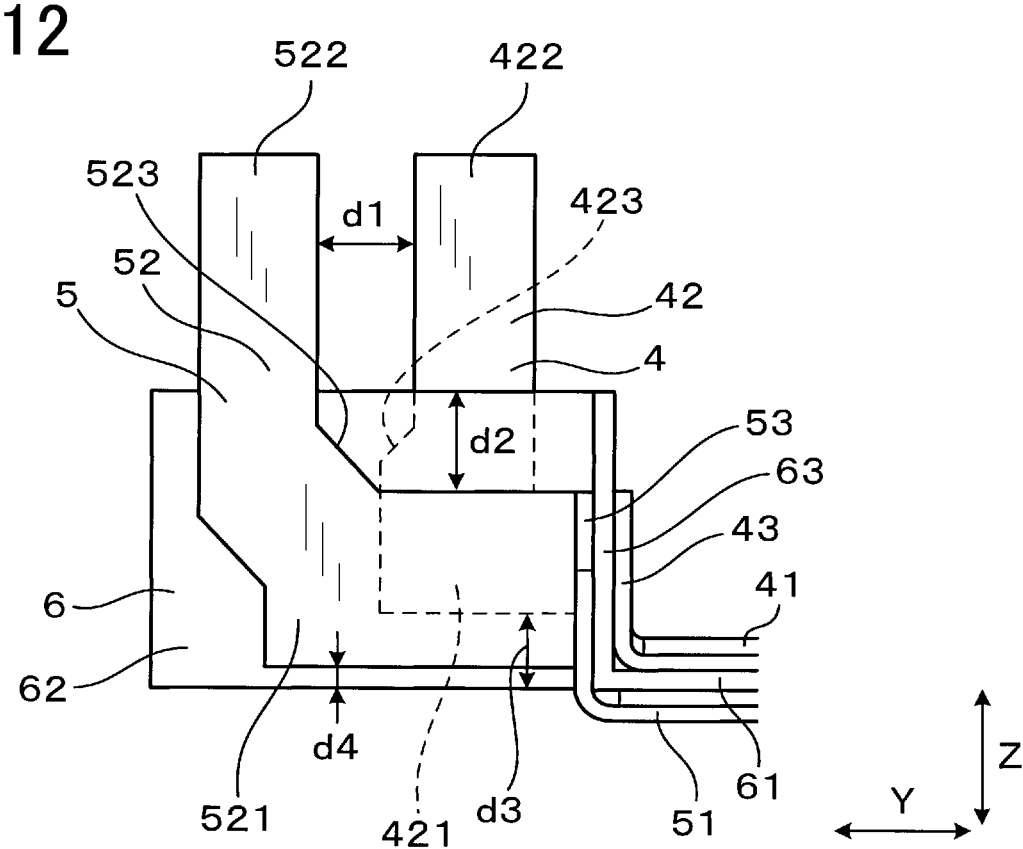
FIG. 12 is a side view along the arrow XII in FIG. 9.
Figure 13:
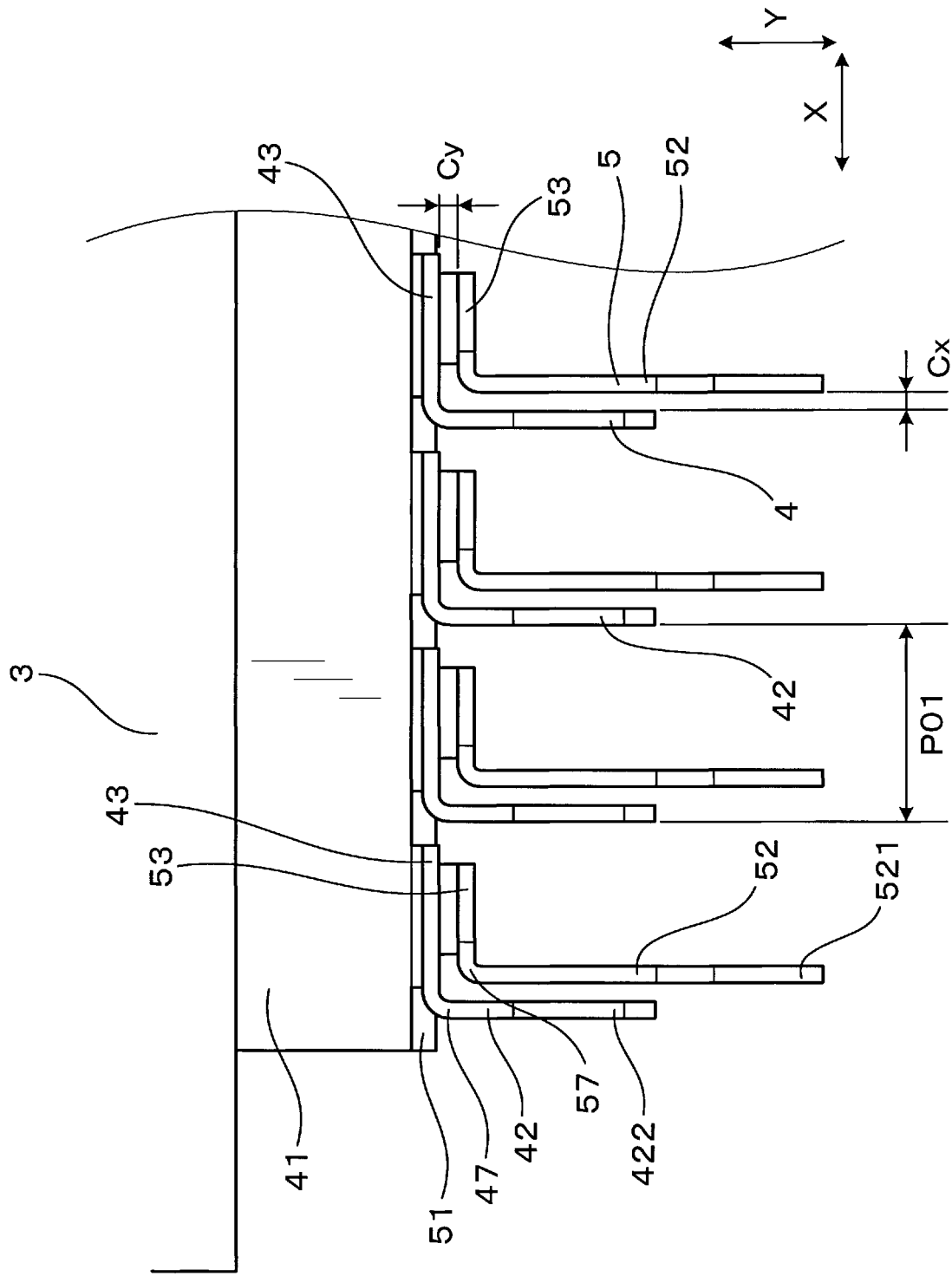
FIG. 13 is an enlarged view of part of FIG. 9.

As shown in FIGS. 11 and 13, each of the positive busbar terminals 42 has a positive busbar terminal base portion 421 extending from the positive busbar base 41 forward in the Y direction and a positive busbar terminal protruding portion 422 protruding from the positive busbar terminal base portion 421 in the Z direction. Similarly, as shown in FIGS. 12-13, each of the negative busbar terminals 52 has a negative busbar terminal base portion 521 extending from the negative busbar base 51 forward in the Y direction and a negative busbar terminal protruding portion 522 protruding from the negative busbar terminal base portion 521 in the Z direction. In addition, it should be noted that for the sake of simplicity, an insulator 6 is omitted from FIG. 13.

Moreover, hereinafter, for the sake of convenience of explanation, in the Z direction, the side toward which the positive busbar terminal protruding portions 422 protrude from the positive busbar terminal base portions 421 and the negative busbar terminal protruding portions 522 protrude from the negative busbar terminal base portions 521 will be referred to as "upper side"; the opposite side to "upper side" will be referred to as "lower side". In addition, it should be noted that unless specified otherwise, the expressions "upper side" and "lower side" used hereinafter are irrelevant to, for example, the vertically upper and lower sides of a vehicle where the electric power conversion apparatus 1 is mounted and used.

As shown in FIGS. 5-12, the positive busbar terminal base portions 421 at least partially overlap the negative busbar terminal base portions 521 in the X direction with the insulator 6 interposed therebetween. On the other hand, the positive busbar terminal protruding portions 422 are arranged apart from the negative busbar terminal protruding portions 522 in the Y direction so that when viewed along the X direction, the positive busbar terminal protruding portions 422 do not overlap the negative busbar terminal protruding portions 522.

As shown in FIGS. 14-17, each of the semiconductor modules 2 has a positive power terminal 24 and a negative power terminal 25. Moreover, as shown in FIGS. 1-4, the positive busbar terminal protruding portions 422 are respectively connected to the positive power terminals 24 of the semiconductor modules 2; the negative busbar terminal protruding portions 522 are respectively connected to the negative power terminals 25 of the semiconductor modules 2.

In the present embodiment, as shown in FIGS. 14-17, each of the semiconductor modules 2 includes a semiconductor module main body 21 which has switching elements built therein and from which the positive and negative power terminals 24 and 25 protrude. Moreover, each of the semiconductor modules 2 also has AC power terminals (not shown) protruding from the semiconductor module main body 21.

Figure 2:
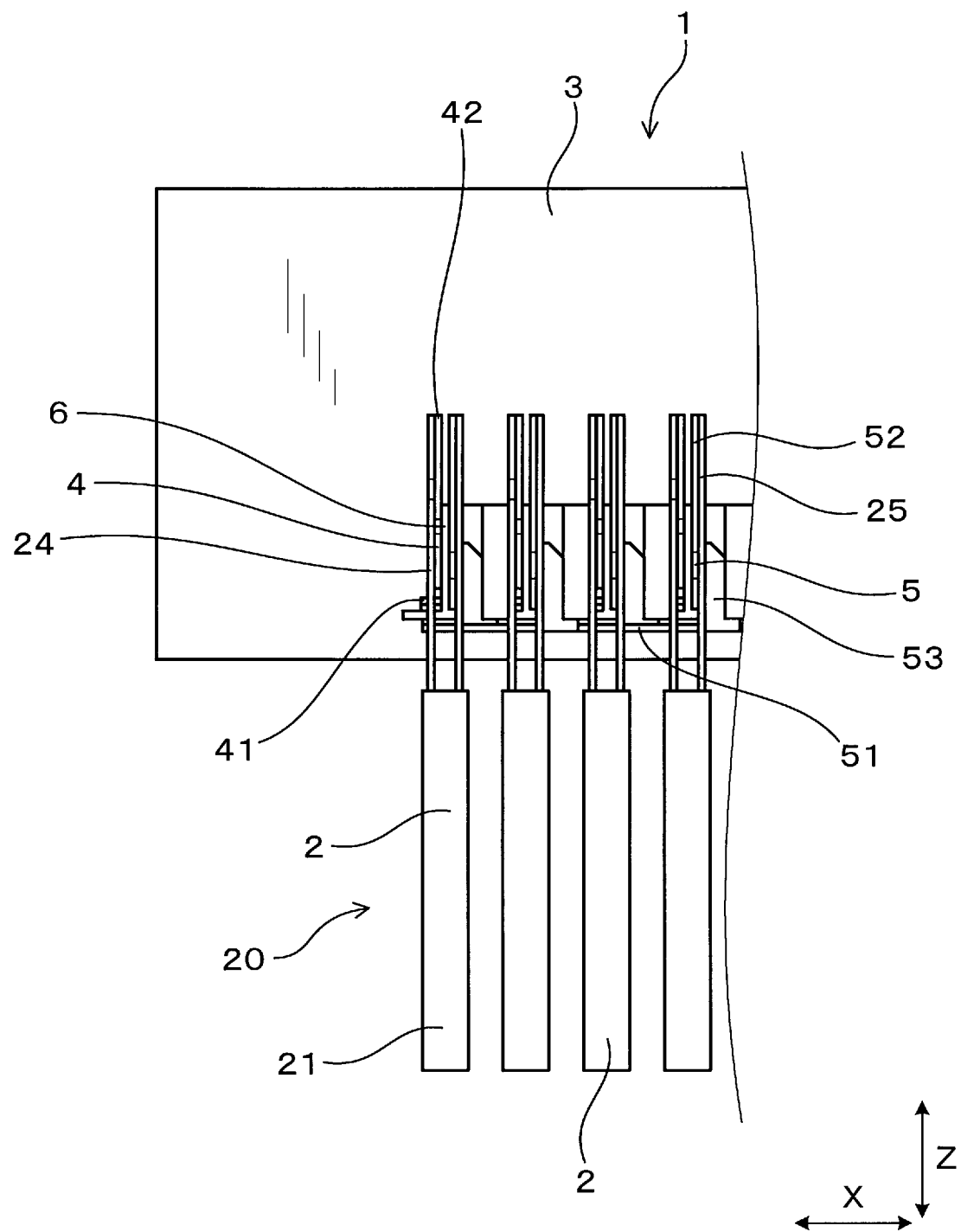
FIG. 2 is a front view of part of the electric power conversion apparatus according to the first embodiment.

As shown in FIGS. 1-2, the semiconductor module main bodies 21 of the semiconductor modules 2 are arranged below the capacitor 3 in the Z direction. Moreover, part of each of the semiconductor module main bodies 21 is arranged under the capacitor 3 in the Z direction. That is, when viewed along the Z direction, each of the semiconductor module main bodies 21 partially overlaps the capacitor 3.

Figure 18:
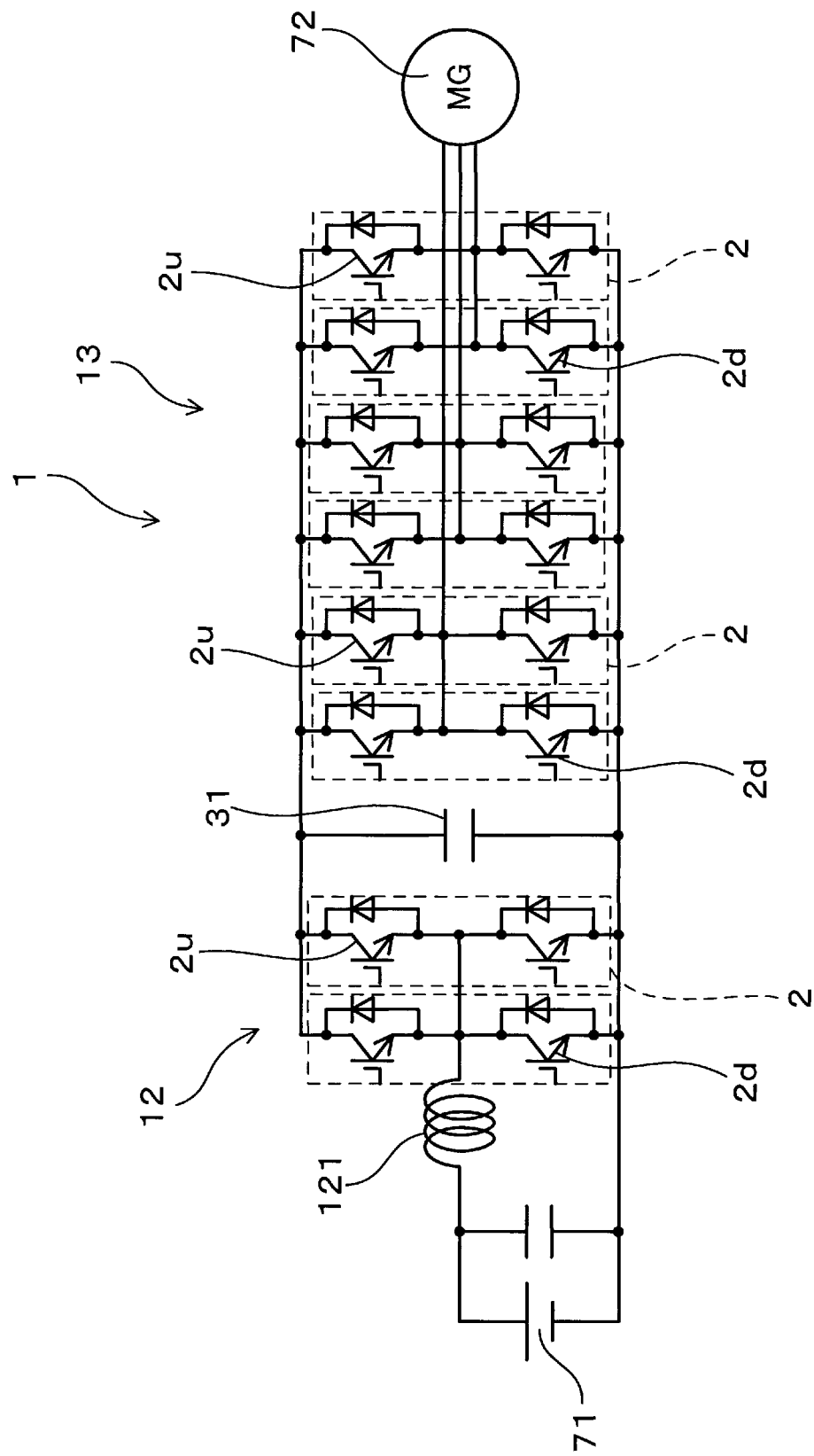
FIG. 18 is a circuit diagram of the electric power conversion apparatus according to the first embodiment.

In the present embodiment, as shown in FIG. 18, the electric power conversion apparatus 1 is configured to covert electric power between a DC power source 71 and a three-phase AC rotating electric machine 72 (more particularly, motor-generator MG).

The electric power conversion apparatus 1 includes a booster circuit 12 and an inverter circuit 13. It should be noted that for the sake of simplicity, components of the booster circuit 12 are shown in none of the figures other than FIG. 18.

The booster circuit 12 is configured with a reactor 121 and some (e.g., two) of the semiconductor modules 2. On the other hand, the inverter circuit 13 is configured with the remaining (e.g., six) semiconductor modules 2. The capacitor 3 is configured with a plurality of capacitor elements 31 (see also FIG. 22) to function as a smoothing capacitor.

When the rotating electric machine 72 functions as an electric motor, the electric power conversion apparatus 1 converts DC power from the DC power source 71 into three-phase AC power, thereby driving the rotating electric machine 72. On the other hand, when the rotating electric machine 72 functions as an electric generator, the electric power conversion apparatus 1 converts three-phase AC power generated by the rotating electric machine 72 into DC power, thereby charging the DC power source 71 or feeding a DC load.

In the inverter circuit 13, each of the semiconductor modules 2 has a pair of an upper-arm switching element $2u$ and a lower-arm switching element $2d$ built therein. The upper-arm and lower-arm switching elements $2u$ and $2d$ are electrically connected in series with each other. Moreover, each of the upper-arm and lower-arm switching elements $2u$ and $2d$ has a flyback diode (or freewheeling diode) connected in antiparallel (or inverse parallel) thereto. The junction point (or node) between the upper-arm and lower-arm switching elements $2u$ and $2d$ is electrically connected to a corresponding one of three electrodes of the rotating electric machine 72. In the present embodiment, each of the upper-arm and lower-arm switching elements $2u$ and $2d$ is implemented by an IGBT (Insulated Gate Bipolar Transistor). However, it should be noted that each of the upper-arm and lower-arm switching elements $2u$ and $2d$ may alternatively be implemented by, for example, a MOSFET (Metal-Oxide-Semiconductor Field-Effect Transistor).

In the present embodiment, for each phase of the three-phase AC rotating electric machine 72, there are provided two semiconductor modules 2 in the inverter circuit 13; the pairs of upper-arm and lower-arm switching elements $2u$ and $2d$ built in the two semiconductor modules 2 are electrically connected in parallel to each other. Accordingly, the total number of the semiconductor modules 2 provided in the inverter circuit 13 is equal to 6 (i.e., 2×3=6).

In addition, the semiconductor modules 2 may be modified to each have two upper-arm switching elements $2u$ and two lower-arm switching elements $2d$ built therein. The two upper-arm switching elements $2u$ are electrically connected in parallel to each other. The two lower-arm switching elements $2d$ are electrically connected in parallel to each other. Moreover, the two parallel-connected upper-arm switching elements $2u$ are electrically connected in series with the two parallel-connected lower-arm switching elements $2d$. In this case, the total number of the semiconductor modules 2 provided in the inverter circuit 13 is reduced to 3.

Moreover, in the present embodiment, in each of the semiconductor modules 2, the collector of the upper-arm switching element 2u is electrically connected to the positive power terminal 24 and the emitter of the lower-arm switching element 2d is electrically connected to the negative power terminal 25.

Figure 16:
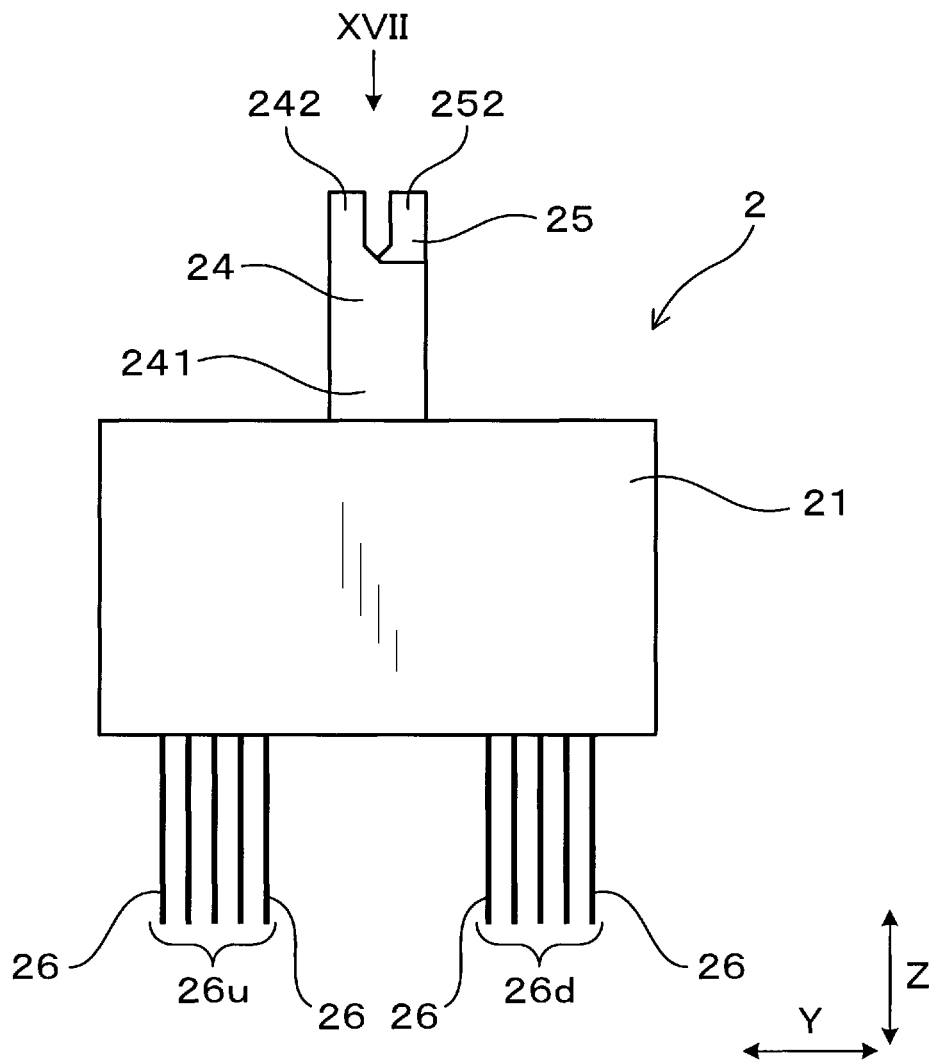
FIG. 16 is a plan view of the semiconductor module shown in FIG. 14.
Figure 17:
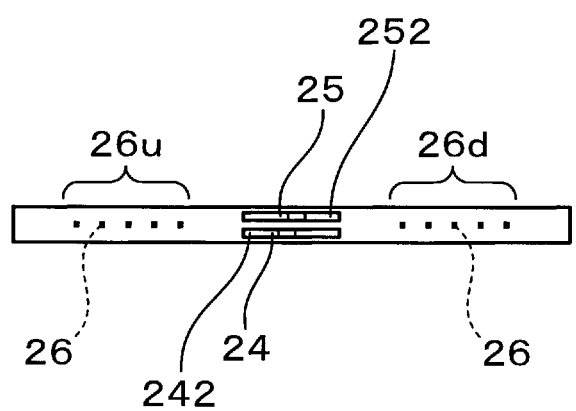
FIG. 17 is a top view along the line XVII in FIG. 16.

As shown in FIGS. 16-17, each of the semiconductor modules 2 also has a plurality of control terminals 26. It should be noted that for the sake of simplicity, the control terminals 26 are shown in none of the figures other than FIGS. 16-17. The control terminals 26 protrude from the semiconductor module main body 21 toward the opposite side to the positive and negative power terminals 24 and 25. That is, the control terminals 26 protrude from the semiconductor module main body 21 downward in the Z direction. The control terminals 26 include a plurality of control terminals 26u electrically connected to the upper-arm switching element 2u and a plurality of control terminals 26d electrically connected to the lower-arm switching element 2d. The control terminals 26 are arranged so that the control terminals 26u electrically connected to the upper-arm switching element 2u are separated in the Y direction from the control terminals 26d electrically connected to the lower-arm switching element 2d. Moreover, as shown in FIG. 17, when viewed along the Z direction, the positive and negative power terminals 24 and 25 are interposed between the control terminals 26u and the control terminals 26d.

As shown in FIGS. 14-17, each of the positive and negative power terminals 24 and 25 is plate-shaped and arranged to have its major surfaces extending perpendicular to the X direction. In addition, hereinafter, unless specified otherwise, the term "perpendicular" encompasses not only "exactly perpendicular" but also "approximately perpendicular".

The positive power terminal 24 has a positive power terminal base portion 241 standing (or extending) upward in the Z direction from the semiconductor module main body 21 and a positive power terminal protruding portion 242 protruding upward in Z direction from the positive power terminal base portion 241. Similarly, the negative power terminal 25 has a negative power terminal base portion 251 standing upward in the Z direction from the semiconductor module main body 21 and a negative power terminal protruding portion 252 protruding upward in Z direction from the negative power terminal base portion 251. The positive and negative power terminals 24 and 25 are arranged so that the positive power terminal base portion 241 and the negative power terminal base portion 251 at least partially overlap each other in the X direction.

As shown in FIGS. 1-4, each of the semiconductor modules 2 is assembled into the electric power conversion apparatus 1 as a part thereof so that the positive power terminal base portion 241 and the negative power terminal base portion 251 overlap each other in the X direction with the insulator 6 interposed therebetween. Moreover, as shown in FIG. 16, when viewed along the X direction, the positive power terminal protruding portion 242 and the negative power terminal protruding portion 252 do not overlap each other.

Figure 14:
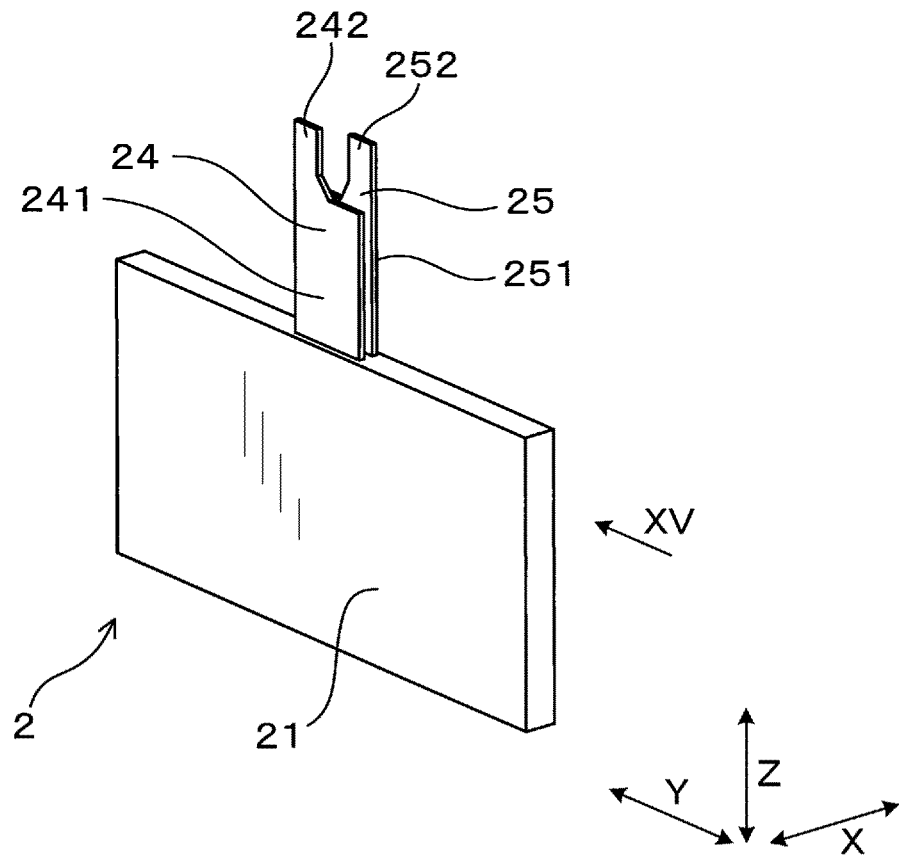
FIG. 14 is a perspective view of one of the semiconductor modules of the electric power conversion apparatus according to the first embodiment.
Figure 15:
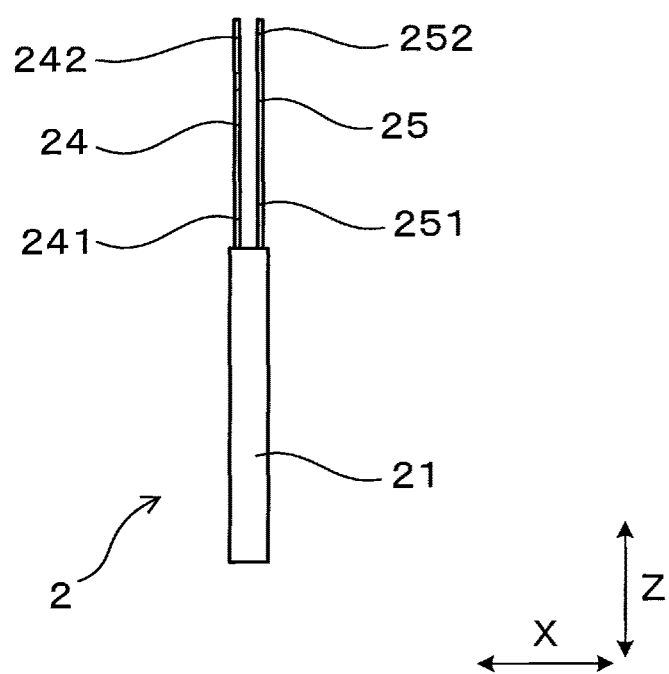
FIG. 15 is a side view along the arrow XV in FIG. 14.

As shown in FIGS. 14 and 16, the positive and negative power terminal protruding portions 242 and 252 have a width in the Y direction that is less than half the width of the positive and negative power terminal base portions 241 and 251 in the Y direction. Moreover, the positive and negative power terminal protruding portions 242 and 252 are arranged apart from each other in the Y direction.

As shown in FIGS. 1-4, for each of the semiconductor modules 2, the positive power terminal protruding portion 242 of the semiconductor module 2 is joined (or connected) to a corresponding one of the positive busbar terminal protruding portions 422, while the negative power terminal protruding portion 252 of the semiconductor module 2 is joined (or connected) to a corresponding one of the negative busbar terminal protruding portions 522.

Figure 3:
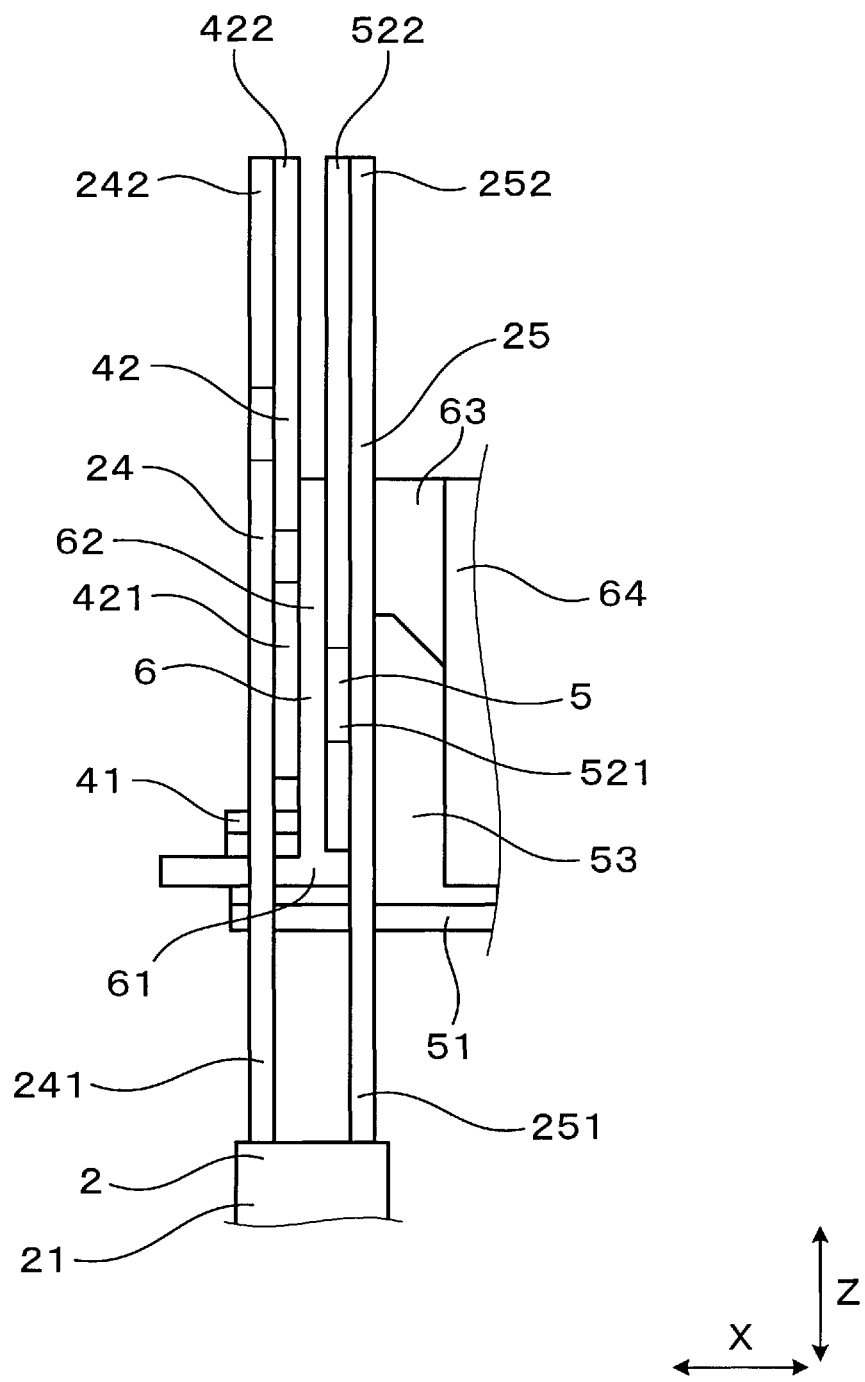
FIG. 3 is an enlarged front view of part of the electric power conversion apparatus according to the first embodiment, wherein a pair of positive and negative power terminals of one of semiconductor modules are connected respectively to positive and negative busbars.
Figure 4:
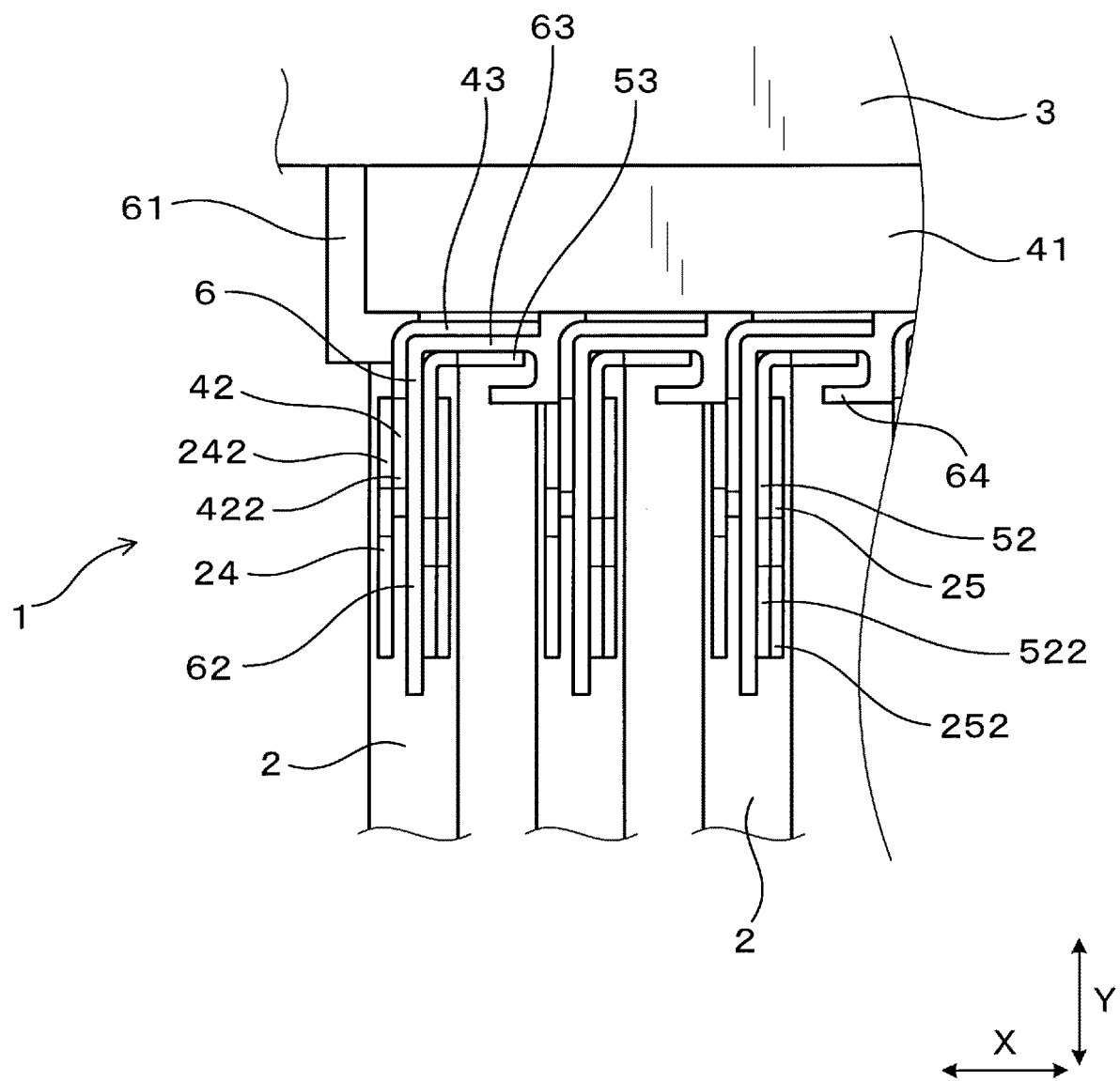
FIG. 4 is a top view of part of the electric power conversion apparatus according to the first embodiment.
Figure 5:
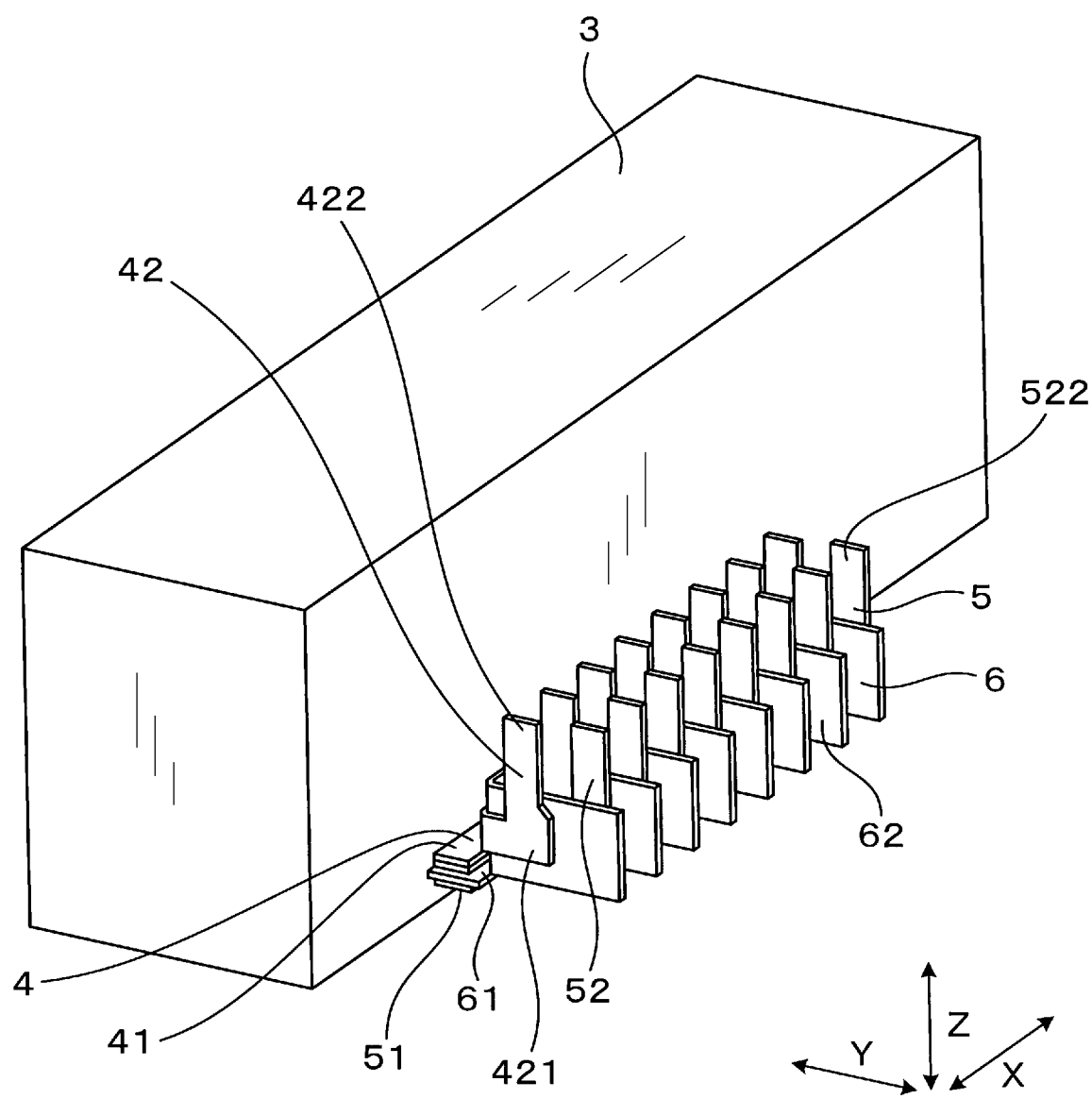
FIG. 5 is a perspective view, from the front left side, of a capacitor and the positive and negative busbars of the electric power conversion apparatus according to the first embodiment.
Figure 7:
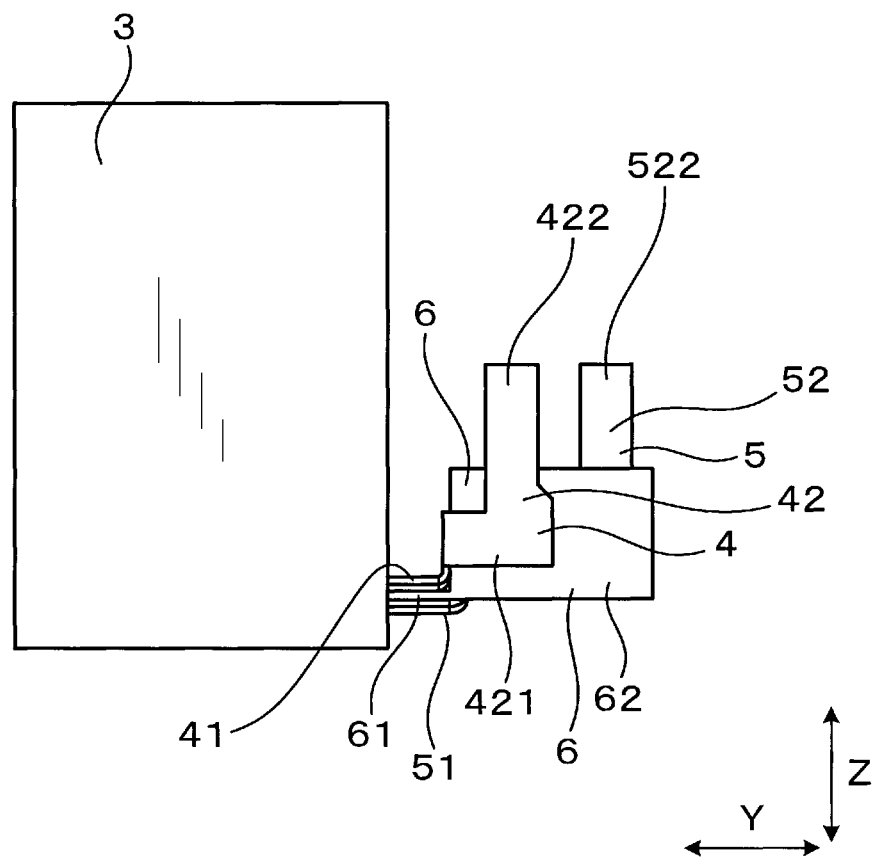
FIG. 7 is a left side view of the capacitor and the positive and negative busbars of the electric power conversion apparatus according to the first embodiment.

More particularly, in the present embodiment, as shown in FIGS. 3-4, for each of the semiconductor modules 2, the positive and negative power terminals 24 and 25 of the semiconductor module 2 are arranged to have both a corresponding one of the positive busbar terminals 42 and a corresponding one of the negative busbar terminals 52 interposed therebetween in the X direction. In other words, the positive and negative power terminals 24 and 25 of the semiconductor module 2 are arranged to sandwich both the corresponding positive busbar terminal 42 and the corresponding negative busbar terminal 52 therebetween in the X direction; the corresponding positive busbar terminal 42 and the corresponding negative busbar terminal 52 are opposed to each other in the X direction with the insulator 6 interposed therebetween. Consequently, the positive and negative power terminals 24 and 25 of the semiconductor module 2 respectively face those surfaces of the corresponding positive busbar terminal 42 and the corresponding negative busbar terminal 52 which are located on the opposite side to the insulator 6.

As shown in FIG. 3, for each of the semiconductor modules 2, the positive power terminal protruding portion 242 of the semiconductor module 2 is arranged to have its upper end flush with the upper end of the corresponding positive busbar terminal protruding portion 422; the positive power terminal protruding portion 242 and the corresponding positive busbar terminal protruding portion 422 are welded to each other at the upper ends thereof. Similarly, the negative power terminal protruding portion 252 of the semiconductor module 2 is arranged to have its upper end flush with the upper end of the corresponding negative busbar terminal protruding portion 522; the negative power terminal protruding portion 252 and the corresponding negative busbar terminal protruding portion 522 are welded to each other at the upper ends thereof.

Moreover, as shown in FIG. 3, all of the upper end of the positive power terminal protruding portion 242, the upper end of the corresponding positive busbar terminal protruding portion 422, the upper end of the negative power terminal protruding portion 252 and the upper end of the corresponding negative busbar terminal protruding portion 522 are substantially flush with each other.

In addition, the welding position between the positive power terminal protruding portion 242 and the corresponding positive busbar terminal protruding portion 422 and the welding position between the negative power terminal protruding portion 252 and the corresponding negative busbar terminal protruding portion 522 are not limited to their upper ends. For example, the positive power terminal protruding portion 242 and the corresponding positive busbar terminal protruding portion 422 may alternatively be welded to each other at abutting surfaces thereof; the negative power terminal protruding portion 252 and the corresponding negative busbar terminal protruding portion 522 may alternatively be welded to each other at abutting surfaces thereof.

As shown in FIGS. 11-13, the positive busbar 4 also includes a plurality of positive busbar connection portions 43 each of which connects between the positive busbar base 41 and a corresponding one of the positive busbar terminals 42. Each of the positive busbar connection portions 43 stands (or extends) upward in the Z direction from the positive busbar base 41 and has its major surfaces extending perpendicular to the Y direction. Similarly, the negative busbar 5 also includes a plurality of negative busbar connection portions 53 each of which connects between the negative busbar base 51 and a corresponding one of the negative busbar terminals 52. Each of the negative busbar connection portions 53 stands (or extends) upward in the Z direction from the negative busbar base 51 and has its major surfaces extending perpendicular to the Y direction. Moreover, as shown FIG. 9, each of the positive busbar connection portions 43 is opposed to a corresponding one of the negative busbar connection portions 53 in the Y direction with the insulator 6 interposed therebetween.

As shown in FIGS. 2-3 and 11-12, the positive busbar terminals 42 are arranged on the opposite side of the positive busbar base 41 to the semiconductor modules 2 in the Z direction; the negative busbar terminals 52 are arranged on the opposite side of the negative busbar base 51 to the semiconductor modules 2 in the Z direction. Moreover, the positive busbar connection portions 43 are also arranged on the opposite side of the positive busbar base 41 to the semiconductor modules 2 in the Z direction; the negative busbar connection portions 53 are also arranged on the opposite side of the negative busbar base 51 to the semiconductor modules 2 in the Z direction.

That is, as shown in FIGS. 11-12, all of the positive busbar terminals 42, the positive busbar connection portions 43, the negative busbar terminals 52 and the negative busbar connection portions 53 are arranged on the upper side of the positive busbar base 41 and the negative busbar base 51 in the Z direction.

Figure 19:
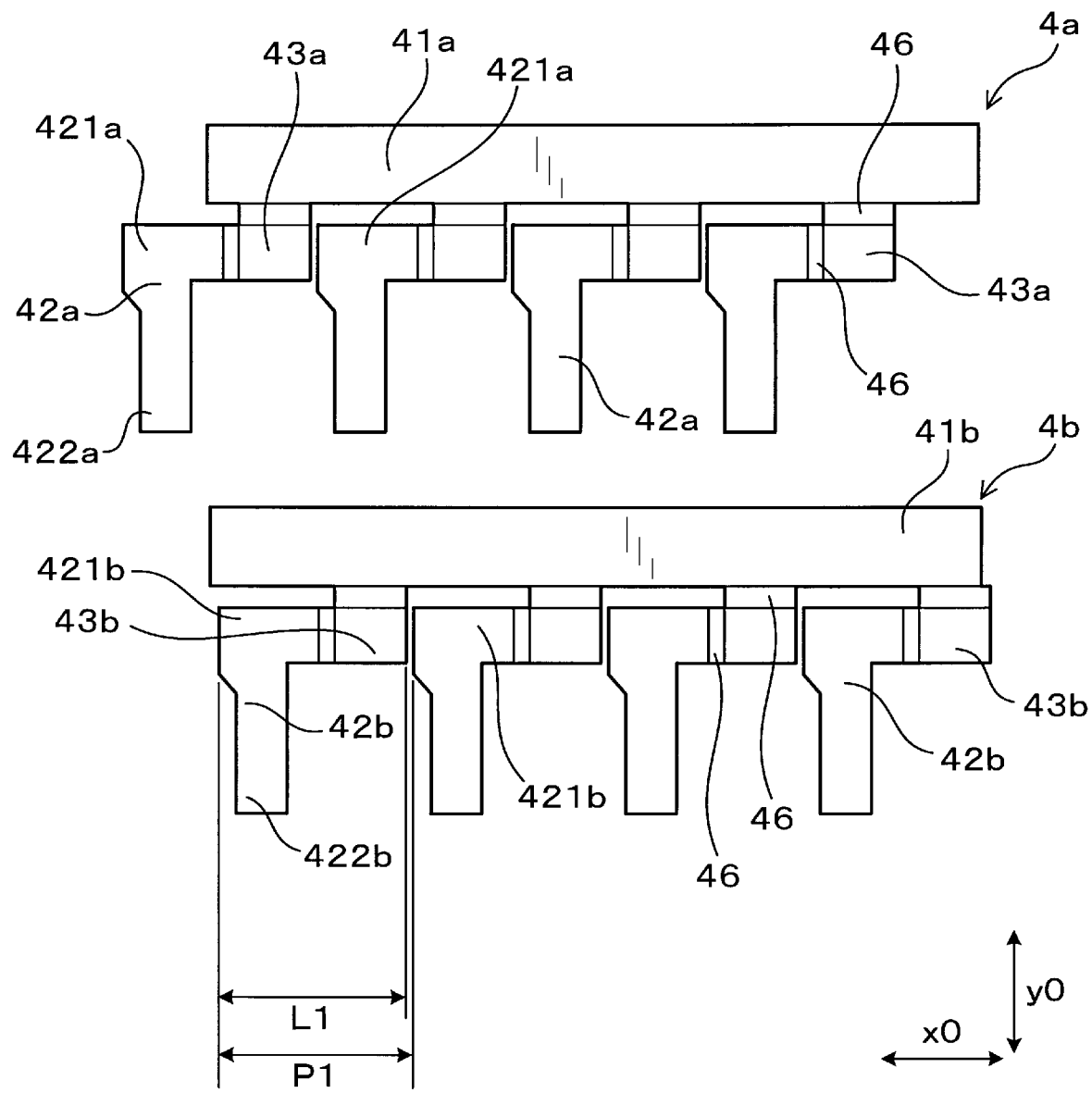
FIG. 19 is a plan view of a pair of metal plates for forming the positive busbar of the electric power conversion apparatus according to the first embodiment.
Figure 20:
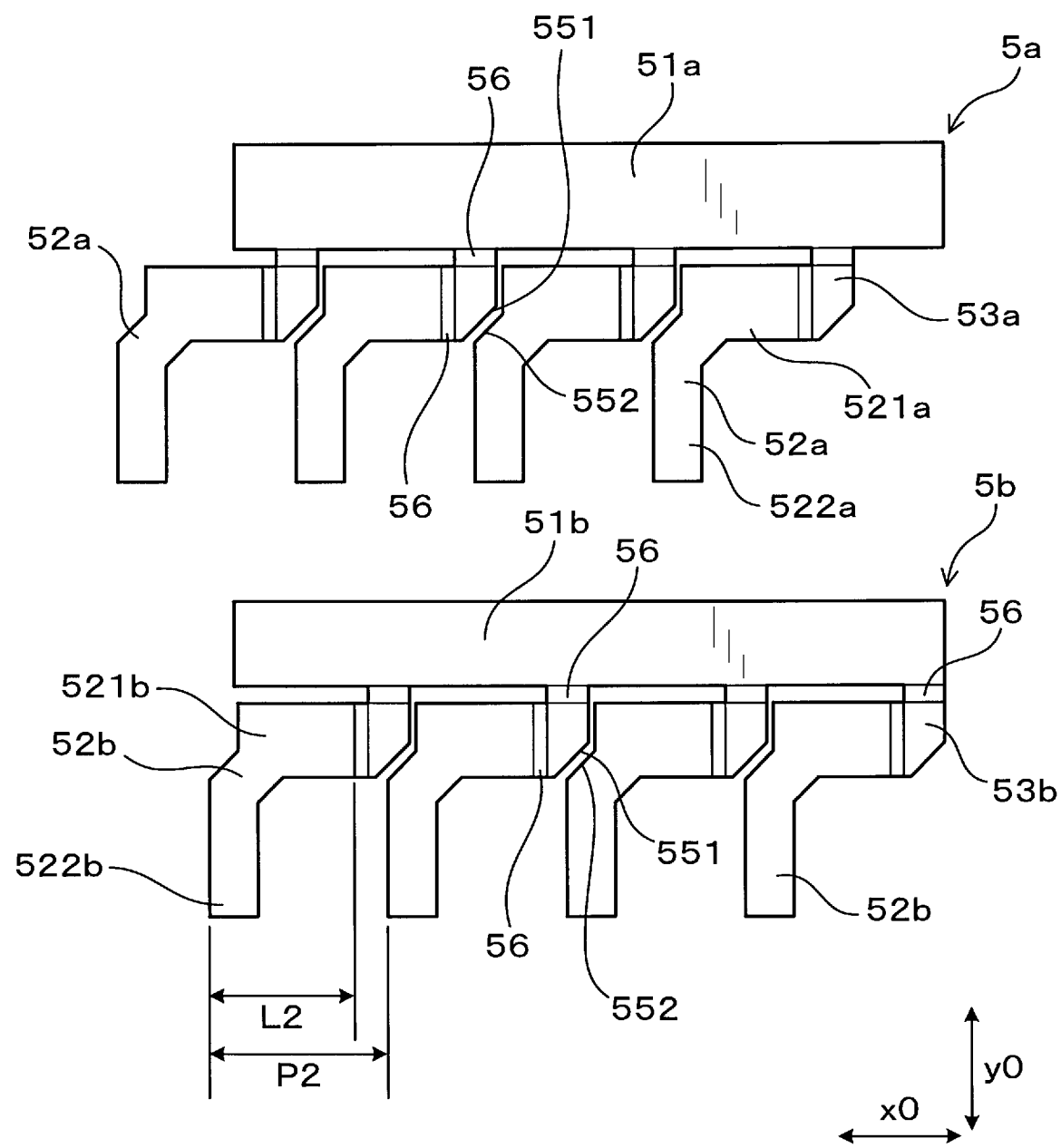
FIG. 20 is a plan view of a pair of metal plates for forming the negative busbar of the electric power conversion apparatus according to the first embodiment.
Figure 21:
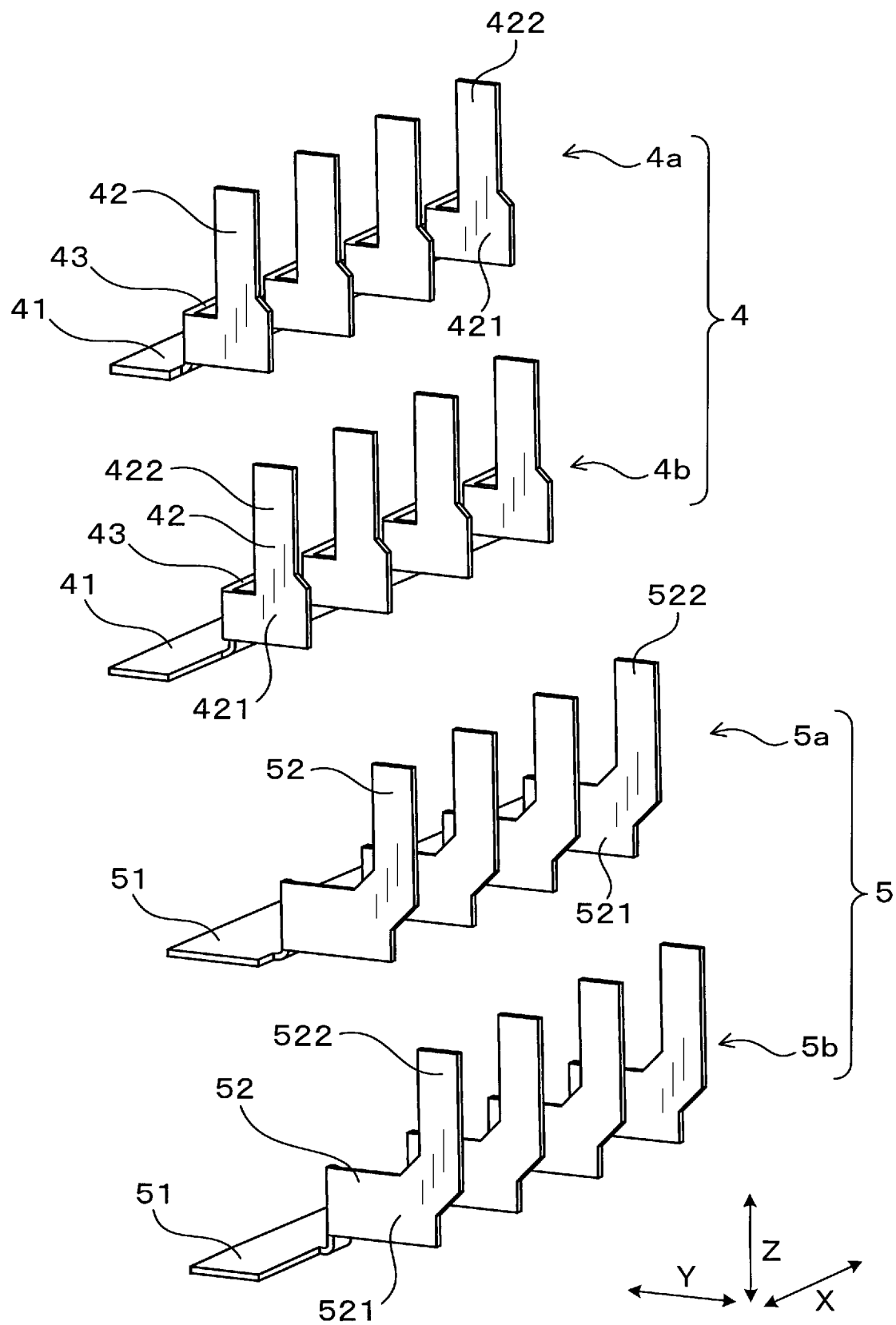
FIG. 21 is a perspective view of both the pair of metal plates bent to form the positive busbar and the pair of metal plates bent to form the negative busbar.

As shown in FIGS. 19 and 21, the positive busbar 4 is formed by assembling a plurality of metal plates. Specifically, the positive busbar base 4 is constituted of portions of the metal plates which are stacked in the Z direction. However, each of the positive busbar terminals 42 is constituted of a portion of only one of the metal plates; for each adjacent pair of the positive busbar terminals 42 in the X direction, the positive busbar terminals 42 of the adjacent pair are respectively constituted of the portions of different ones of the metal plates. Similarly, as shown in FIGS. 20-21, the negative busbar 5 is also formed by assembling a plurality of metal plates. Specifically, the negative busbar base 51 is constituted of portions of the metal plates which are stacked in the Z direction. However, each of the negative busbar terminals 52 is constituted of a portion of only one of the metal plates; for each adjacent pair of the negative busbar terminals 52 in the X direction, the negative busbar terminals 52 of the adjacent pair are respectively constituted of the portions of different ones of the metal plates.

More particularly, in the present embodiment, each of the positive and negative busbars 4 and 5 is formed by assembling two metal plates.

Specifically, the positive busbar 4 is formed of two metal plates 4a and 4b which initially have flat shapes as shown in FIG. 19. That is, the metal plates 4a and 4b initially have flat major surfaces; the initial shapes of the metal plates 4a and 4b viewed along a normal direction z0 to the major surfaces are as shown in FIG. 19. The metal plates 4a and 4b are then bent in a suitable manner to have final shapes as shown in FIG. 21. Thereafter, the metal plates 4a and 4b are assembled together to form the positive busbar 4.

As shown in FIG. 19, before being bent, each of the metal plates 4a and 4b has a rectangular base portion 41a or 41b for forming the positive busbar base 41. Hereinafter, the longitudinal direction of the base portion 41a or 41b will be simply referred to as "x0 direction"; the lateral direction of the base portion 41a or 41b will be simply referred to as "y0 direction". Moreover, each of the metal plates 4a and 4b also has connection portions 43a or 43b for forming the positive busbar connection portions 43; the connection portions 43a or 43b each protrude from the base portion 41a or 41b toward one side (i.e., downward in FIG. 19) in the y0 direction and are spaced from one another in the x0 direction. Furthermore, each of the metal plates 4a and 4b also has terminal base portions 421a or 421b for forming the positive busbar terminal base portions 421; each of the terminal base portions 421a or 421b protrudes from a corresponding one of the connection portions 43a or 43b toward one side (i.e., leftward in FIG. 19) in the x0 direction. Each of the metal plates 4a and 4b further has terminal protruding portions 422a or 422b for forming the positive busbar terminal protruding portions 422; each of the terminal protruding portions 422a or 422b protrudes from a corresponding one of the terminal base portions 421a or 421b toward the opposite side to the base portion 41a or 41b (i.e., downward in FIG. 19) in the y0 direction. In addition, each corresponding (or connected) pair of the terminal base portions 421a or 421b and the terminal protruding portions 422a or 422b together constitute one terminal portion 42a or 42b for forming one of the positive busbar terminals 42.

Moreover, as shown in FIG. 19, in each of the metal plates 4a and 4b, for each pair of the connection portions 43a or 43b adjacent to each other in the x0 direction, there is provided a slight clearance in the x0 direction between one of the pair of the connection portions 43a or 43b and the terminal base portion 421a or 421b protruding from the other one of the pair of the connection portions 43a or 43b. As above, all of the base portion 41a, the connection portions 43a, the terminal base portions 421a and the terminal protruding portions 422a are connected together to constitute the single metal plate 4a for forming the positive busbar 4. In addition, in the metal plate 4a, there are provided bending margins 46 between the base portion 41a and the connection portions 43a and between the connection portions 43a and the terminal base portions 421a. Similarly, all of the base portion 41b, the connection portions 43b, the terminal base portions 421b and the terminal protruding portions 422b are connected together to constitute the single metal plate 4b for forming the positive busbar 4. In addition, in the metal plate 4b, there are provided bending margins 46 between the base portion 41b and the connection portions 43b and between the connection portions 43b and the terminal base portions 421b.

In each of the metal plates 4a and 4b, the length L1 of each connected pair of the connection portions 43a or 43b and the terminal base portions 421a or 421b in the x0 direction is constrained to be less than the formation pitch of the connection portions 43a or 43b, i.e., the formation pitch P1 of the terminal portions 42a or 42b. Therefore, it is necessary to set the formation pitch P1 of the terminal portions 42a in the metal plate 4a (or the formation pitch P1 of the terminal portions 42b in the metal plate 4b) to be greater than the sum of the length of each of the positive busbar connection portions 43 in the X direction and the length of each of the positive busbar terminal base portions 421 in the Y direction in the positive busbar 4. That is, if the positive busbar 4 was formed of only one metal plate 4a or 4b, it would be necessary to set the formation pitch of the positive busbar terminals 42 to be large. However, in the present embodiment, by forming the positive busbar 4 with the plurality of metal plates 4a and 4b, it becomes possible to reduce the arrangement pitch P01 of the positive busbar terminals 42 as shown in FIG. 13.

In addition, in the present embodiment, the metal plate 4b has an upper plate part 44 and a front plate part 45, both of which will be described in detail later, formed integrally therewith. However, for the sake of simplicity, both the upper plate part 44 and the front plate part 45 are omitted from FIGS. 19 and 21.

Similar to the above-described positive busbar 4, the negative busbar 5 is formed of two metal plates 5a and 5b which initially have flat shapes as shown in FIG. 20. That is, the metal plates 5a and 5b initially have flat major surfaces; the initial shapes of the metal plates 5a and 5b viewed along the normal direction z0 to the major surfaces are as shown in FIG. 20. The metal plates 5a and 5b are then bent in a suitable manner to have final shapes as shown in FIG. 21. Thereafter, the metal plates 5a and 5b are assembled together to form the negative busbar 5.

As shown in FIGS. 20-21, each of the metal plates 5a and 5b has a base portion 51a or 51b for forming the negative busbar base 51, connection portions 53a or 53b for forming the negative busbar connection portions 53 and terminal portions 52a or 52b for forming the negative busbar terminals 52. Moreover, each of the terminal portions 52a or 52b consists of a terminal base portion 521a or 521b for forming one of the negative busbar terminal base portions 521 and a terminal protruding portion 522a or 522b for forming one of the negative busbar terminal protruding portions 522. In addition, in the metal plate 5a, there are provided bending margins 56 between the base portion 51a and the connection portions 53a and between the connection portions 53a and the terminal base portions 521a; in the metal plate 5b, there are provided bending margins 56 between the base portion 51b and the connection portions 53b and between the connection portions 53b and the terminal base portions 521b.

Figure 22:
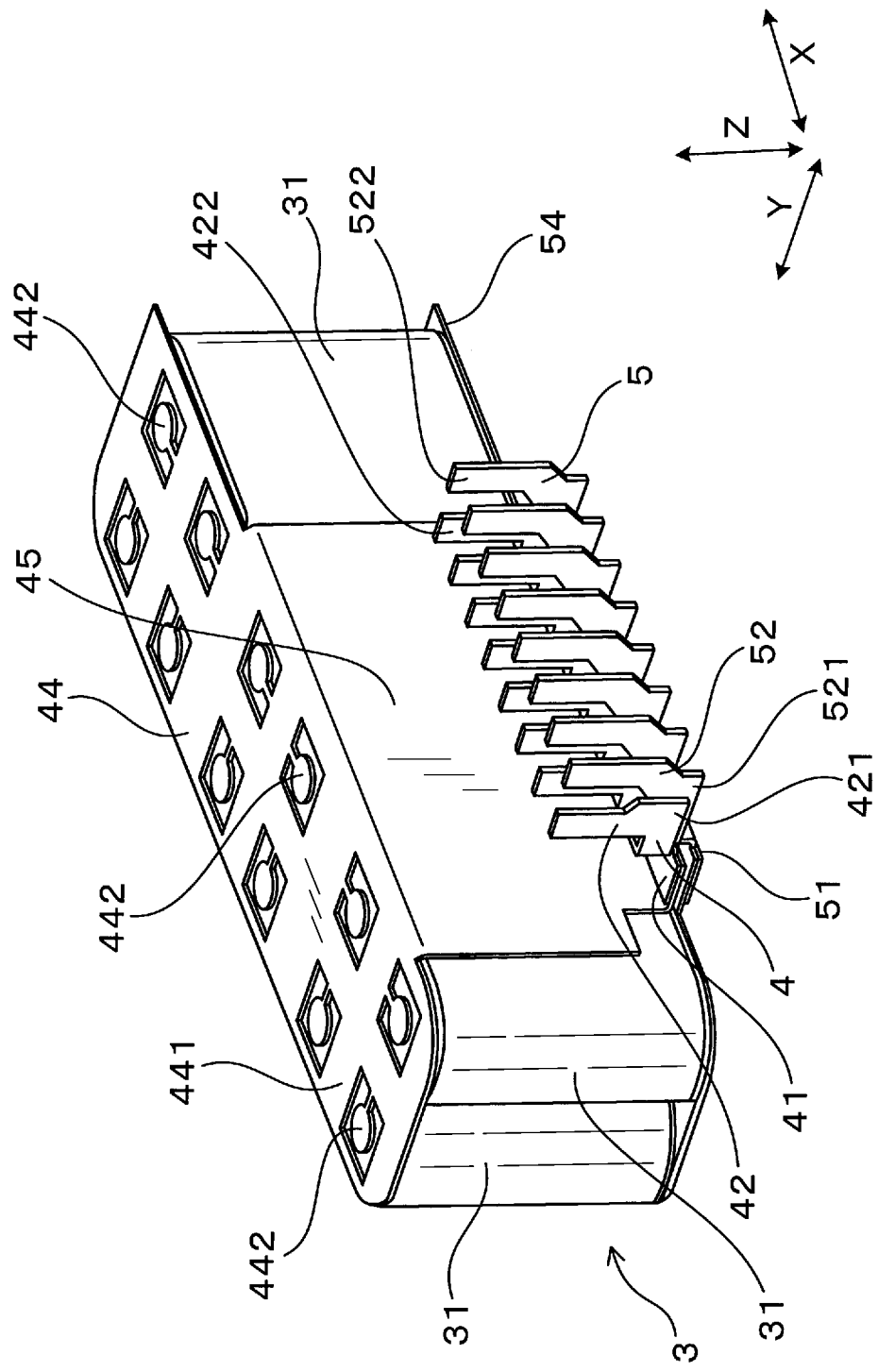
FIG. 22 is a perspective view showing the capacitor and the positive and negative busbars of the electric power conversion apparatus according to the first embodiment, omitting encapsulating resin covering the capacitor.

As shown in FIG. 20, in each of the metal plates 5a and 5b, each of the connection portions 53a or 53b has a first oblique surface 551 formed at a corner thereof which is on both the opposite side to the bending margin 56 provided between the connection portion 53a or 53b and the corresponding terminal base portion 521a or 521b in the x0 direction and the opposite side to the bending margin 56 provided between the connection portion 53a or 53b and the base portion 51a or 51b in the y0 direction; the first oblique surface 551 extends obliquely with respect to both the x0 direction and the y0 direction. Moreover, for each of the first oblique surfaces 551 of the connection portions 53a or 53b, that one of the terminal portions 52a or 52b which is opposed to the first oblique surface 551 has a second oblique surface 552 formed therein; the second oblique surface 552 faces and extends along the first oblique surface 551. Consequently, with the above formation of the first and second oblique surfaces 551 and 552, it becomes possible to increase the length L2 of each of the terminal portions 52a or 52b in the x0 direction. Furthermore, the length of each of the connection portions 53a or 53b in the x0 direction is greater than the length of each of the connection portions 43a or 43b in the x0 direction in each of the metal plates 4a and 4b for forming the positive busbar 4. Therefore, even when the arrangement pitch P2 of the terminal portions 52a or 52b is set to be equal to the arrangement pitch P1 of the terminal portions 42a or 42b in each of the metal plates 4a and 4b (see FIG. 19), it is still possible to set the length L2 of each of the terminal portions 52a or 52b in the x0 direction to be sufficiently large. As a result, as shown in FIGS. 21-22, it becomes possible to arrange the negative busbar terminal protruding portions 522 sufficiently forward from the positive busbar terminal protruding portions 422.

In addition, the definition of the x0 direction, the y0 direction and the z0 direction in the metal plates 5a and 5b for forming the negative busbar 5 is similar to that in the metal plates 4a and 4b for forming the positive busbar 4. In the present embodiment, the metal plate 5a has a lower plate part 54 and a front plate part 55, both of which will be described in detail later, formed integrally therewith. However, for the sake of simplicity, both the lower plate part 54 and the front plate part 55 are omitted from FIGS. 20-21.

In each of the metal plates 4a and 4b for forming the positive busbar 4, the connection portions 43a or 43b are bent upward at the bending margins 46 provided between the connection portions 43a or 43b and the base portion 41a or 41b, thereby respectively forming the positive busbar connection portions 43. Moreover, the terminal portions 42a or 42b are bent forward at the bending margins 46 provided between the terminal portions 42a or 42b and the connection portions 43a or 43b, thereby respectively forming the positive busbar terminals 42. After being bent as above, the metal plates 4a and 4b as shown in FIG. 21 are stacked in the Z direction and joined at their respective base portions 41a and 41b, thereby forming the positive busbar 4. More specifically, the metal plates 4a and 4b are stacked so that: the base portion 41a of the metal plate 4a and the base portion 41b of the metal plate 4b are stacked in the Z direction to together form the positive busbar base 41; the positive busbar terminals 42 formed in the metal plate 4a are arranged alternately with the positive busbar terminals 42 formed in the metal plate 4b in the X direction; and the intervals between adjacent positive busbar terminals 42 in the X direction are substantially constant. Consequently, by forming the positive busbar 4 with the two metal plates 4a and 4b, the arrangement pitch P01 of the positive busbar terminals 42 in the positive busbar 4 (see FIG. 13) is reduced to half the formation pitch P1 of the terminal portions 42a or 42b in each of the metal plates 4a and 4b (see FIG. 19). In addition, in the present embodiment, the metal plates 4a and 4b are joined by welding, thereby together constituting the positive busbar 4.

Similar to the positive busbar 4, the negative busbar 5 is formed by bending, stacking and joining the metal plates 5a and 5b.

As shown in FIG. 21, the negative busbar base 51 has a larger width in the Y direction than the positive busbar base 41. The negative busbar terminals 52 have a larger width in the Y direction than the positive busbar terminals 42. The negative busbar connection portions 53 have a smaller width in the X direction than the positive busbar connection portions 43. The positive busbar 4 and the negative busbar 5 have almost the same shape.

In addition, the positive busbar 4 and the negative busbar 5 may also have other shapes. For example, the positive busbar 4 may have the shape of the negative busbar 5 as described above while the negative busbar 5 has the shape of the positive busbar 4 as described above.

As shown in FIG. 13, the distance Cy between each facing pair of the positive busbar connection portions 43 and the negative busbar connection portions 53 in the Y direction is equal to the distance Cx between each facing pair of the positive busbar terminals 42 and the negative busbar terminals 52 in the X direction. That is, the distances between the positive busbar 4 and the negative busbar 5 are kept substantially constant both in the X direction and the Y direction.

It is preferable that the distances Cx and Cy between the positive busbar 4 and the negative busbar 5 be, for example, less than or equal to the plate thickness of the positive busbar 4 or the negative busbar 5.

The distances Cx and Cy between the positive busbar 4 and the negative busbar 5 may be set to be, for example, less than or equal to 0.8 mm. It is preferable that the distances Cx and Cy be less than or equal to 0.5 mm. It is more preferable that the distances Cx and Cy be less than or equal to 0.3 mm.

Moreover, the positive busbar 4 has a plurality of positive busbar bent portions 47 each of which is formed between one corresponding pair of the positive busbar terminals 42 and the positive busbar connection portions 43. Similarly, the negative busbar 5 has a plurality of negative busbar bent portions 57 each of which is formed between one corresponding pair of the negative busbar terminals 52 and the negative busbar connection portions 53. The distance between each facing pair of the positive busbar bent portions 47 and the negative busbar bent portions 57 is greater than the above distances Cx and Cy.

As shown in FIG. 13, a front end of the negative busbar base 51 is located forward from a front end of the positive busbar base 41 in the Y direction.

As shown in FIG. 22, the capacitor 3 is formed by integrating a plurality of capacitor elements 31 that are arranged parallel to each other. Specifically, the capacitor elements 31 are arranged in two rows in the Y direction. Moreover, the capacitor elements 31 are electrically connected in parallel to each other.

In the present embodiment, each of the capacitor elements 31 is implemented by a film capacitor element. Specifically, each of the capacitor elements 31 is formed by winding a metalized film and arranged with its winding axis coinciding with the Z direction. Moreover, each of the capacitor elements 31 has a pair of electrode surfaces respectively at opposite ends thereof in the Z direction.

The positive busbar 4 has the upper plate part 44 arranged on an upper electrode surface of the capacitor 3 (or the upper electrode surfaces of the capacitor elements 31) and the front plate part 45 arranged on a front side surface of the capacitor 3. From a lower end of the front plate part 45, the positive busbar base 41 protrudes forward.

The negative busbar 5 has the lower plate part 54 arranged on a lower electrode surface of the capacitor 3 (or the lower electrode surfaces of the capacitor elements 31). From a front end of the lower plate part 54, the negative busbar base 51 protrudes forward.

The upper plate part 44 of the positive busbar 4 includes a grid-shaped frame portion 441 and a plurality of connection terminal portions 442 each of which protrudes from the frame portion 441 into one of meshes formed in the frame portion 441. Each of the connection terminal portions 442 is placed in contact with and thus electrically connected to the upper electrode surface of a corresponding one of the capacitor elements 31. The protruding directions of the connection terminal portions 442 in the front row from the frame portion 441 are different from the protruding directions of the connection terminal portions 442 in the rear row from the frame portion 441. Specifically, the left half of the connection terminal portions 442 in the front row protrude from the frame portion 441 leftward in the X direction; the right half of the connection terminal portions 442 in the front row protrude from the frame portion 441 rightward in the X direction; all of the connection terminal portions 442 in the rear row protrude from the frame portion 441 backward in the Y direction. With the above configuration, it becomes possible to reduce the differences between electric current paths from the semiconductor modules 2 to the capacitor elements 31, thereby suppressing variation in electric currents flowing to the capacitor elements 31.

Though not shown in the figures, similar to the upper plate part 44 of the positive busbar 4, the lower plate part 54 of the negative busbar 5 also includes a grid-shaped frame portion and a plurality of connection terminal portions. The shapes and arrangement of the frame portion and connection terminal portions of the lower plate part 54 are similar to those of the frame portion 441 and connection terminal portions 442 of the upper plate part 44.

Moreover, the direction of electric current flowing in the front plate part 45 of the positive busbar 4 is opposite to the direction of electric currents flowing in the capacitor elements 31. Consequently, it is possible to lower the inductance at the front plate part 45.

As shown in FIGS. 4-7, the insulator 6 is interposed between each corresponding pair of the positive busbar terminal base portions 421 and the negative busbar terminal base portions 521 as well as between the positive busbar base 41 and the negative busbar base 51. Moreover, the insulator 6 is also interposed between each corresponding pair of the positive busbar connection portions 43 and the negative busbar connection portions 53.

Figure 8:
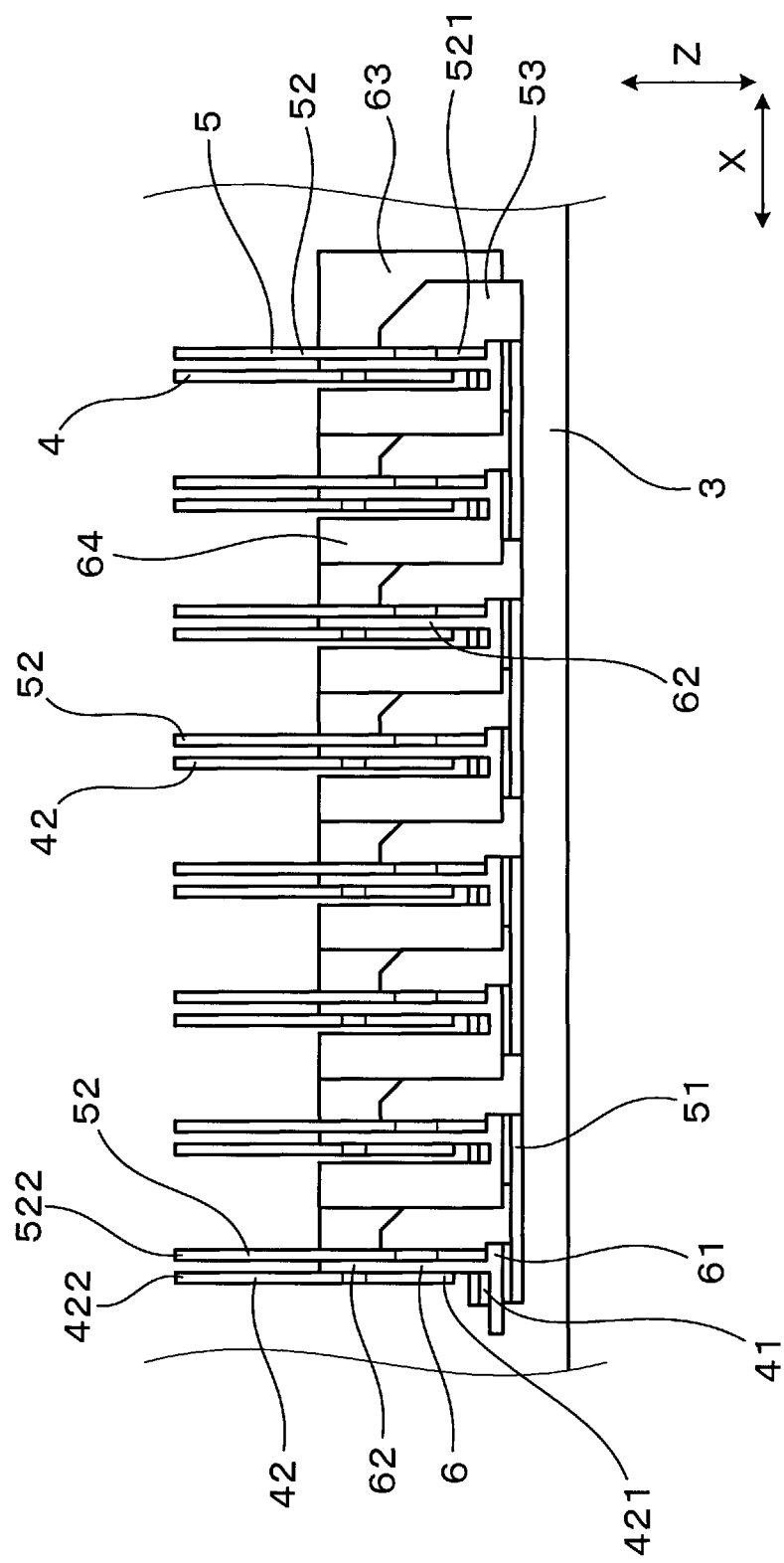
FIG. 8 is a front view of part of the capacitor and the positive and negative busbars of the electric power conversion apparatus according to the first embodiment.
Figure 9:
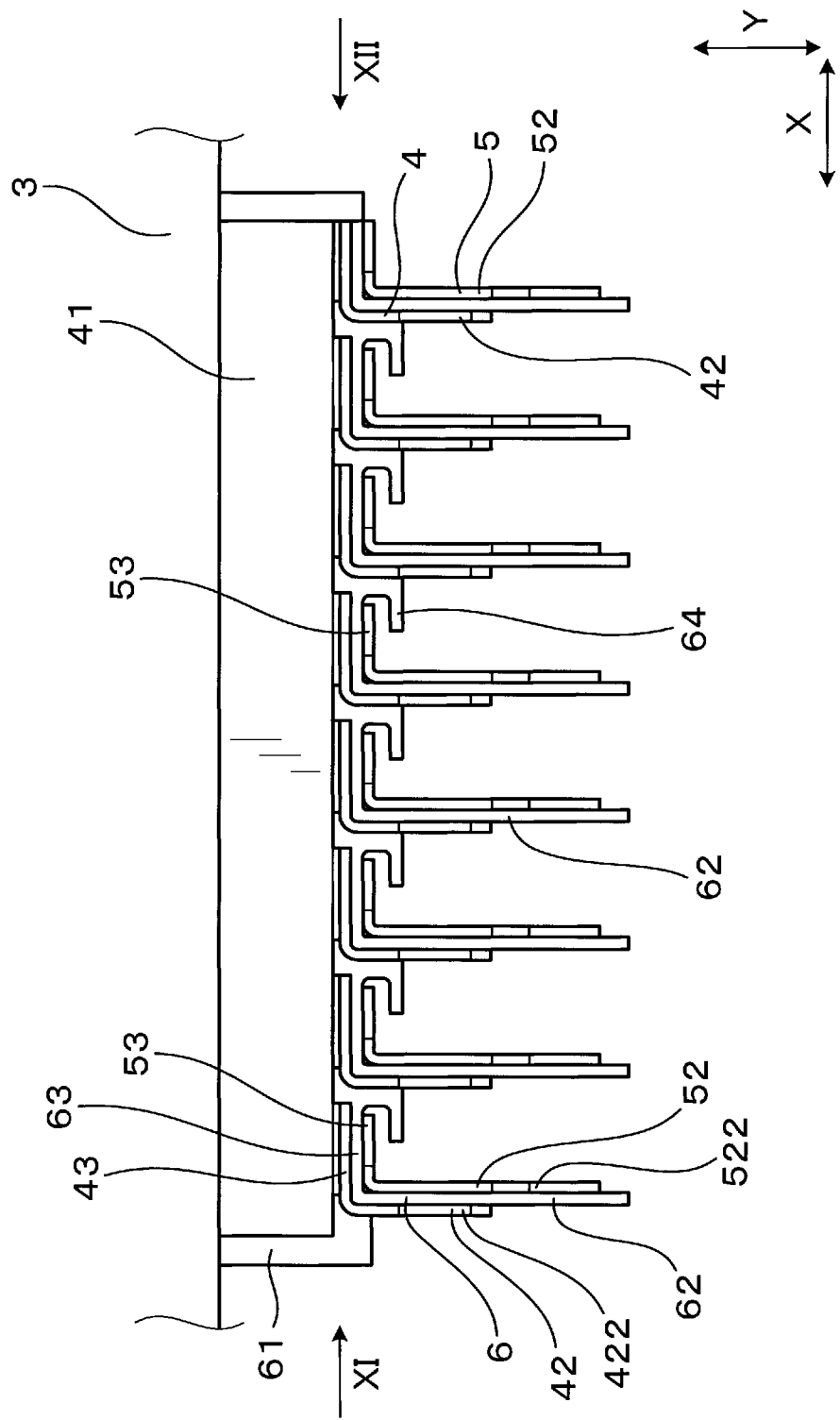
FIG. 9 is a top view of part of the capacitor and the positive and negative busbars of the electric power conversion apparatus according to the first embodiment.
Figure 10:
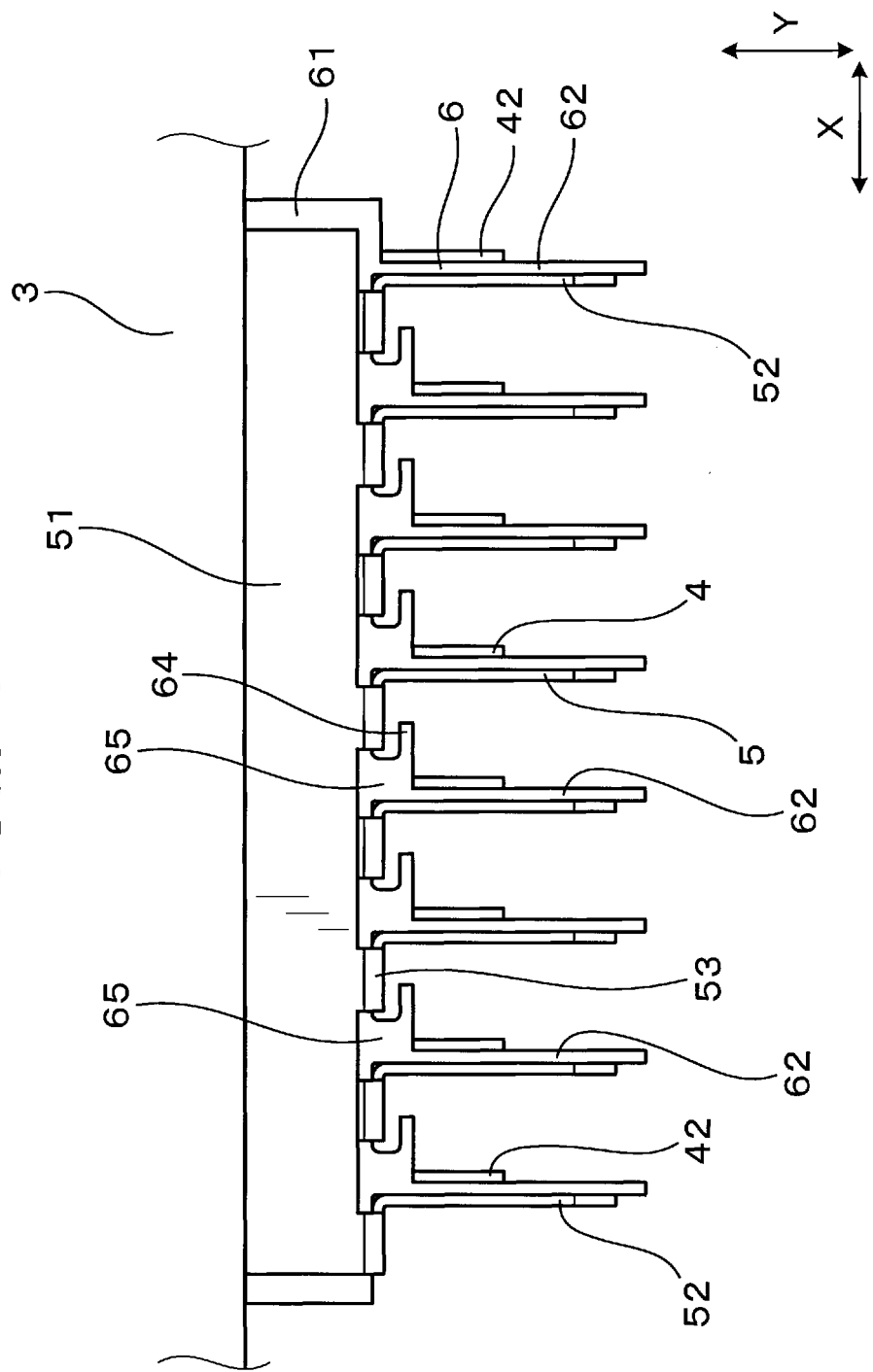
FIG. 10 is a bottom view of part of the capacitor and the positive and negative busbars of the electric power conversion apparatus according to the first embodiment.
Figure 23:
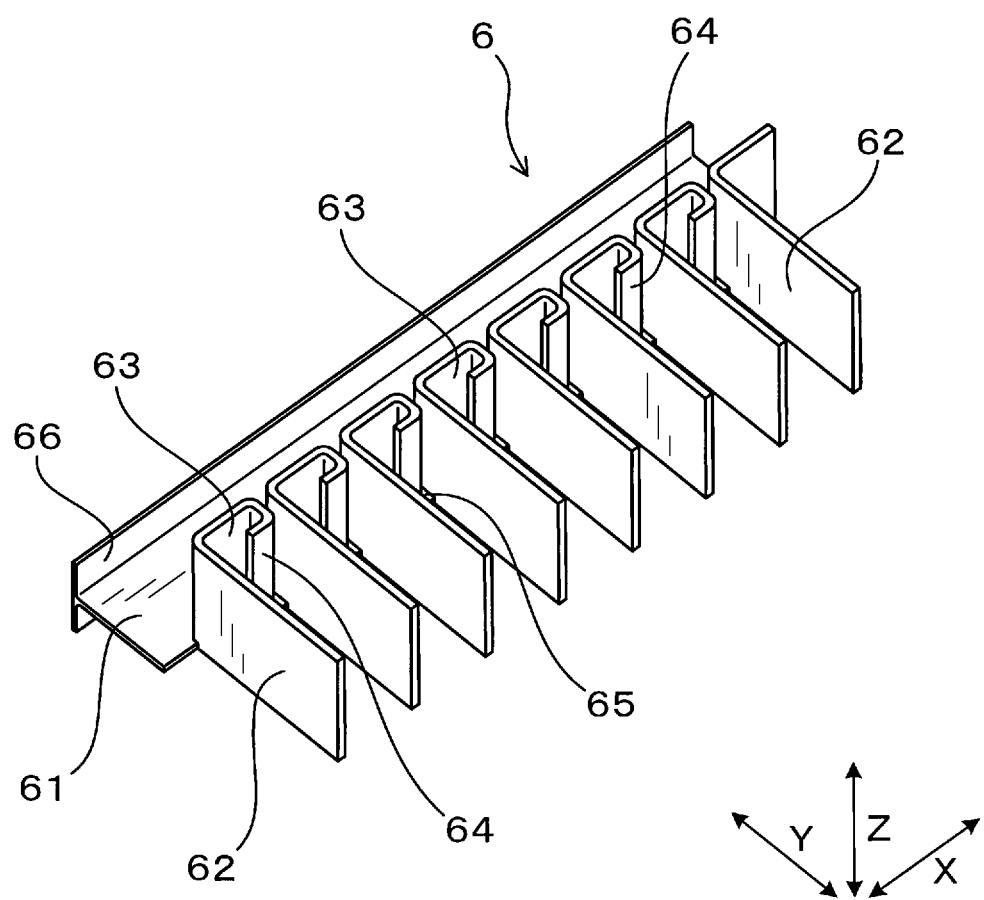
FIG. 23 is a perspective view, from the upper side, of an insulator of the electric power conversion apparatus according to the first embodiment.
Figure 24:
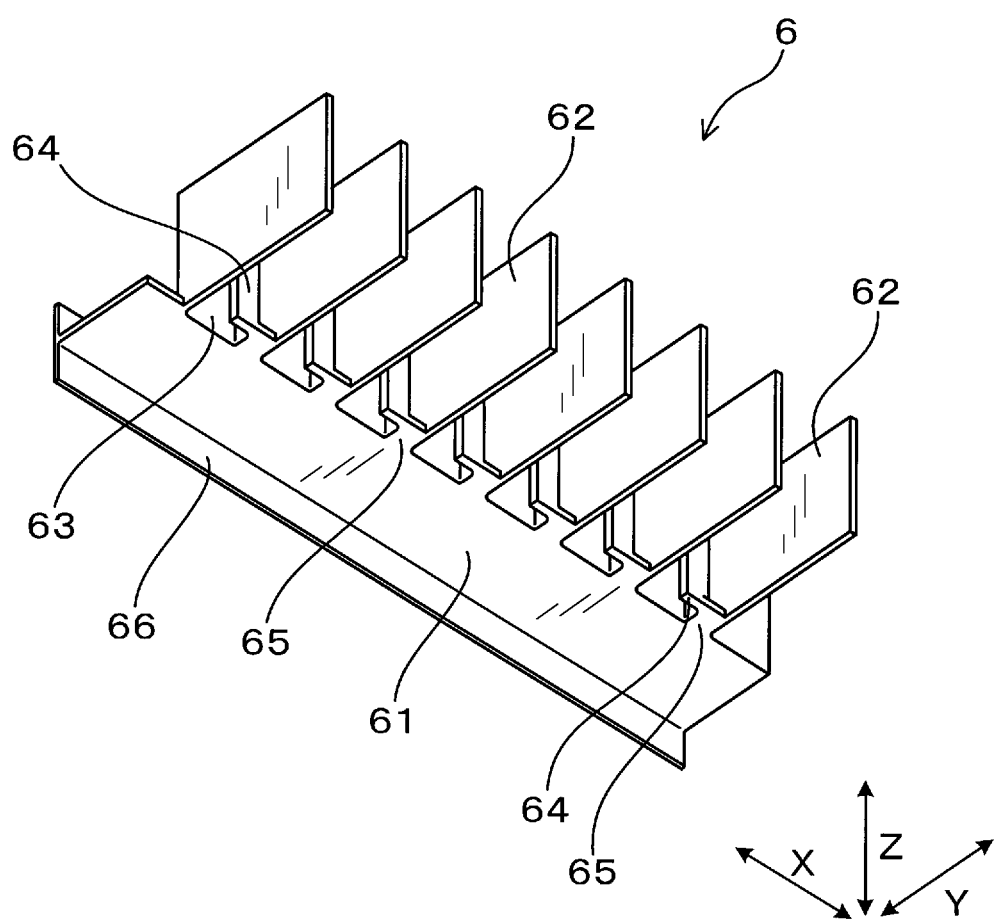
FIG. 24 is a perspective view, from the lower side, of the insulator of the electric power conversion apparatus according to the first embodiment.

Specifically, as shown in FIGS. 23-24, the insulator 6 has a first insulating portion 61, a plurality of second insulating portions 62 and a plurality of third insulating portions 63. As shown in FIGS. 11-12, the first insulating portion 61 is interposed between the positive busbar base 41 and the negative busbar base 51 to electrically insulate them from each other. As shown in FIGS. 8-10, each of the second insulating portions 62 is interposed between one corresponding pair of the positive busbar terminals 42 and the negative busbar terminals 52 to electrically insulate the corresponding pair of the positive and negative busbar terminals 42 and 52 from each other. Similarly, each of the third insulating portions 63 is interposed between one corresponding pair of the positive busbar connection portions 43 and the negative busbar connection portions 53 to electrically insulate the corresponding pair of the positive and negative busbar connection portions 43 and 53 from each other.

As shown in FIGS. 23-24, the first insulating portion 61 has the shape of a flat plate and is arranged perpendicular to the Z direction. The second insulating portions 62 branch off from the first insulating portion 61. Each of the second insulating portions 62 also has the shape of a flat plate and is arranged perpendicular to the X direction.

Each of the third insulating portions 63 connects between the first insulating portion 61 and a corresponding one of the second insulating portions 62. Specifically, each of the third insulating portions 63 extends from a front end of the first insulating portion 61 upward in the Z direction and from a rear end of the corresponding second insulating portion 62 backward in the X direction. Each of the third insulating portions 63 also has the shape of a flat plate and is arranged perpendicular to the Y direction.

Moreover, for each of the third insulating portions 63, there is formed a folded-back portion 64 at the right end of the third insulating portion 63 (i.e., the end of the third insulating portion 63 on the opposite side to the corresponding second insulating portion 62 in the X direction); the folded-back portion 64 is folded back on the opposite side of the third insulating portion 63 to the first insulating portion 61 in the Y direction. That is, the folded-back portion 64 is folded back, at the right end of the third insulating portion 63 and on the front side of the third insulating portion 63, into a substantially U-shape. As shown in FIGS. 4 and 9, in the space formed between the folded-back portion 64 and the third insulating portion 63, there is located the right end of a corresponding one of the negative busbar connection portions 53. In addition, no folded-back portion 64 is formed at the right end of that one of the third insulating portions 63 which is located rightmost in all of the third insulating portions 63.

The length of the folded-back portion 64 in the X direction may be set to be in the range of, for example, 1 to 7 mm. The width of the space formed between the folded-back portion 64 and the third insulating portion 63 in the Y direction may be set to be in the range of, for example, 2 to 3 mm. In this case, it is possible to secure a sufficient creepage distance between the pair of one of the negative busbar connection portions 53 and one of the positive busbar terminals 42 which are adjacent to each other in the X direction with the folded-back portion 64 interposed therebetween; it is also possible to facilitate the assembly of the positive busbar 4 and the negative busbar 5 to the insulator 6.

Moreover, as shown in FIGS. 10 and 24, between the lower end of the folded-back portion 64 and the lower end of that one of the second insulating portions 62 which is located immediately rightward of the folded-back portion 64, there is formed a bottom plate portion 65. On an upper surface of the bottom plate portion 65, there is arranged a corresponding one of the positive busbar bent portions 47 formed between the positive busbar terminals 42 and the positive busbar connection portions 43.

As shown in FIGS. 23-24, the insulator 6 further includes a rear plate part 66 that is formed at the rear end of the first insulating portion 61 to extend from the first insulating portion 61 both upward and downward in the Z direction. The rear plate part 66 is arranged between the front side surfaces of the capacitor elements 31 included in the capacitor 3 and the positive and negative busbars 4 and 5.

The insulator 6 is formed by, for example, resin molding. Moreover, all of the first insulating portion 61, the second insulating portions 62, the third insulating portions 63, the folded-back portions 64, the bottom plate portions 65 and the rear plate part 66 are formed integrally into one piece.

As shown in FIGS. 9-10, the first insulating portion 61 is arranged to extend over the entire region where the positive busbar base 41 and the negative busbar base 51 are opposed to each other in the Z direction. In other words, the first insulating portion 61 is arranged to completely shield the positive busbar base 41 and the negative busbar base 51 from each other. Moreover, the first insulating portion 61 protrudes from the positive busbar base 41 and the negative busbar base 51 both leftward and rightward in the X direction and forward in the Y direction.

As shown in FIGS. 11-12, when viewed along the X direction, each of the second insulating portions 62 extends over the whole of a corresponding pair of the positive and negative busbar terminal base portions 421 and 521. In other words, each of the second insulating portions 62 is arranged to completely shield the corresponding pair of the positive and negative busbar terminal base portions 421 and 521 from each other. Moreover, when viewed along the X direction, each of the second insulating portions 62 protrudes from the corresponding pair of the positive and negative busbar terminal base portions 421 and 521 both upward and downward in the Z direction and forward in the Y direction.

With the above arrangement, the electrical clearance (or insulation distance) between each corresponding pair of the positive and negative busbar terminal protruding portions 422 and 522 is equal to the distance d1 between the front end of the positive busbar terminal protruding portion 422 and the rear end of the negative busbar terminal protruding portion 522 in the Y direction. Moreover, the electrical clearance between each corresponding pair of one of the positive busbar terminal base portions 421 and one of the negative power terminals 25 is equal to the distance d2 between the upper end of the positive busbar terminal base portion 421 and the upper end of the corresponding second insulating portion 62 of the insulator 6 in the Z direction. Similarly, the electrical clearance between each corresponding pair of one of the negative busbar terminals 52 and one of the positive power terminals 24 is equal to the distance d2 between the upper end of the negative busbar terminal base portion 521 and the upper end of the corresponding second insulating portion 62 of the insulator 6 in the Z direction. Moreover, the electrical clearance between each of the positive busbar terminal base portions 421 and the negative busbar base 51 is equal to the distance d3 between the lower end of the positive busbar terminal base portion 421 and the lower end of the corresponding second insulating portion 62 of the insulator 6 in the Z direction. The electrical clearance between each corresponding pair of one of the negative busbar terminal base portions 521 and one of the positive power terminals 24 is equal to the distance d4 between the lower end of the negative busbar terminal base portion 521 and the lower end of the corresponding second insulating portion 62 of the insulator 6 in the Z direction.

As shown in FIGS. 11-12, when viewed along the X direction, the positive busbar terminal base portions 421 overlap part of the negative busbar terminal base portions 521. That is, the entire positive busbar terminal base portions 421 overlap the negative busbar terminal base portions 521; part of the negative busbar terminal base portions 521 does not overlap the positive busbar terminal base portions 421. Specifically, the negative busbar terminal base portions 521 protrude from the positive busbar terminal base portions 421 forward in the Y direction.

Moreover, as shown in FIGS. 11-12, each of the positive busbar terminal protruding portions 422 has an inclined front end edge 423 formed at the front end of a lower part of the positive busbar terminal protruding portion 422; the inclined front end edge 423 is inclined backward as it extends from its lower end to its upper end. On the other hand, each of the negative busbar terminal protruding portions 522 has an inclined rear end edge 523 formed at the rear end of a lower part of the negative busbar terminal protruding portion 522; the inclined rear end edge 523 is inclined forward as it extends from its lower end to its upper end. Moreover, the lower ends of the inclined front end edges 423 of the positive busbar terminal protruding portions 422 are located upward from the lower ends of the inclined rear end edges 523 of the negative busbar terminal protruding portions 522. Furthermore, the lower ends of the inclined front end edges 423 of the positive busbar terminal protruding portions 422 are also located upward from the upper ends of the positive busbar terminal base portions 421.

Next, operational effects of the electric power conversion apparatus 1 according to the present embodiment will be described.

In the electric power conversion apparatus 1, as shown in FIGS. 11-12, the positive busbar terminals 42 and the negative busbar terminals 52 are arranged so that the positive busbar terminal base portions 421 at least partially overlap the negative busbar terminal base portions 521 in the X direction with the insulator 6 interposed therebetween. More specifically, each adjacent pair of the positive busbar terminal base portions 421 and the negative busbar terminal base portions 521 at least partially overlap each other in the X direction with the insulator 6 interposed therebetween.

With the above arrangement, it is possible to reduce the intervals between the positive busbar terminals 42 and the negative busbar terminals 52 in the X direction while ensuring electrical insulation therebetween. Consequently, it becomes possible to minimize the size (or dimension) of the electric power conversion apparatus 1 in the X direction.

Moreover, with the positive busbar terminals 42 and the negative busbar terminals 52 overlapping at the positive busbar terminal base portions 421 and the negative busbar terminal base portions 521 with the insulator 6 interposed therebetween, it becomes possible to lower the inductance at the positive and negative busbars 4 and 5.

Further, in the electric power conversion apparatus 1, as shown in FIGS. 11-12, the positive busbar terminal protruding portions 422 are arranged apart from the negative busbar terminal protruding portions 522 in the Y direction so that when viewed along the X direction, the positive busbar terminal protruding portions 422 do not overlap the negative busbar terminal protruding portions 522. Consequently, it becomes possible to arrange the positive busbar terminals 42 and the negative busbar terminals 52 close to each other in the X direction while ensuring electrical insulation between the positive busbar terminal protruding portions 422 and the negative busbar terminal protruding portions 522. Moreover, it also becomes possible to easily connect the positive power terminals 24 and negative power terminals 25 of the semiconductor modules 2 respectively to the positive busbar terminal protruding portions 422 and the negative busbar terminal protruding portions 522.

In the electric power conversion apparatus 1, as shown in FIGS. 1-4, for each of the semiconductor modules 2, the positive power terminal 24 and negative power terminal 25 of the semiconductor module 2 are arranged so that: the positive power terminal base portion 241 and the negative power terminal base portion 251 at least partially overlap each other in the X direction with the insulator 6 interposed therebetween; and the positive power terminal protruding portion 242 and the negative power terminal protruding portion 252 do not overlap each other in the X direction. Consequently, it becomes possible to effectively lower the impedance while ensuring electrical insulation between the positive power terminal 24 and negative power terminal 25.

The reduction in the inductance at the connection portions between the positive and negative busbars 4 and 5 and the semiconductor modules 2 achievable according to the present embodiment will be described with reference to FIG. 25. It should be noted that for the sake of simplicity, the insulator 6 is omitted from FIG. 25.

Figure 25:
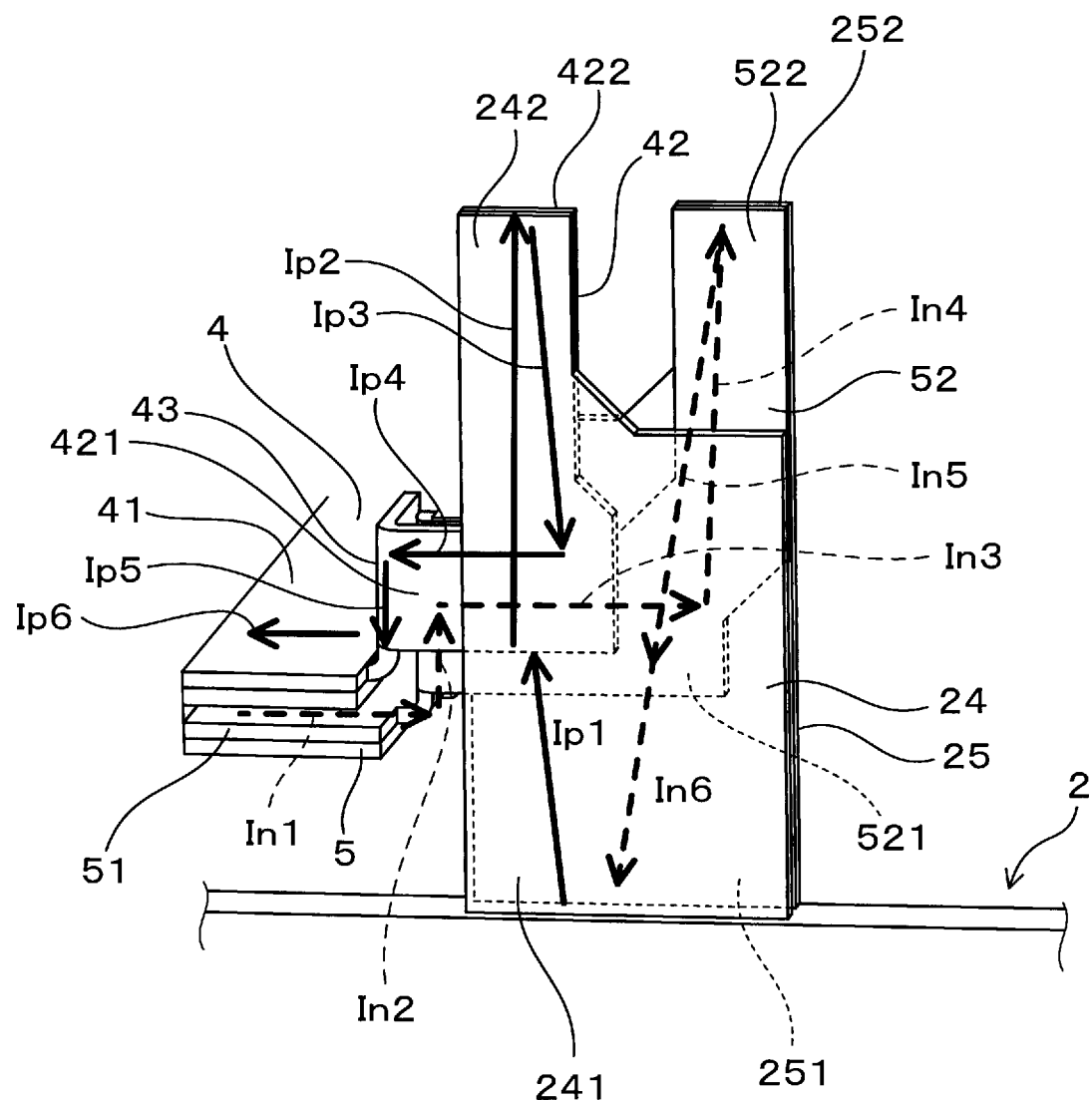
FIG. 25 is a schematic view illustrating the paths of electric currents flowing between one of the semiconductor modules and the capacitor via the positive and negative busbars in the electric power conversion apparatus according to the first embodiment.

In FIG. 25, paths of electric current flowing from the positive power terminal 24 of one of the semiconductor modules 2 to the positive electrode of the capacitor 3 are designated by solid-line arrows Ip1-Ip6, while paths of electric current flowing from the negative electrode of the capacitor 3 to the negative power terminal 25 of the semiconductor module 2 are designated by dashed-line arrows In1-In6.

First, as indicated by Ip1 and Ip2, the electric current, which flows out of the semiconductor module 2, flows upward through the positive power terminal base portion 241 and the positive power terminal protruding portion 242 to the upper end of the positive power terminal protruding portion 242. Then, the electric current flows to the corresponding positive busbar terminal protruding portion 422 via the weld (or joint) formed between the upper end of the positive power terminal protruding portion 242 and the upper end of the corresponding positive busbar terminal protruding portion 422. Thereafter, as indicated by Ip3, the electric current flows downward through the corresponding positive busbar terminal protruding portion 422 to the corresponding positive busbar terminal base portion 421. Further, as indicated by Ip4, the electric current changes its direction to flow backward through the corresponding positive busbar terminal base portion 421 to the corresponding positive busbar connection portion 43. Then, as indicated by Ip5, the electric current further changes its direction to flow downward through the corresponding positive busbar connection portion 43 to the positive busbar base 41. Thereafter, as indicated by the Ip6, the electric current flows backward through the positive busbar base 41 to the positive electrode of the capacitor 3.

On the other hand, the electric current, which flows out of the capacitor 3, flows forward through the negative busbar base 51 to the corresponding negative busbar connection portion 53, as indicated by In1. Then, as indicated by In2, the electric current changes its direction to flow upward through the corresponding negative busbar connection portion 53 to the corresponding negative busbar terminal base portion 521. Thereafter, as indicated by In3, the electric current further changes its direction to flow forward through the corresponding negative busbar terminal base portion 521. Further, as indicated by In4, the electric current changes its direction to flow upward through the corresponding negative busbar terminal base portion 521 and the corresponding negative busbar terminal protruding portion 522 to the upper end of the corresponding negative busbar terminal protruding portion 522. Then, the electric current flows to the negative power terminal protruding portion 252 via the weld (or joint) formed between the upper end of the corresponding negative busbar terminal protruding portion 522 and the upper end of the negative power terminal protruding portion 252. Thereafter, as indicated by In5 and In6, the electric current flows downward, through the negative power terminal protruding portion 252 and the negative power terminal base portion 251, into the semiconductor module 2.

Of the above-described electric current paths Ip1-Ip6 and In1-In6, there are pairs of the paths which are located close to each other and in which the electric currents respectively flow in opposite directions. Specifically, the paths Ip1 and In6 are located closed to each other; the directions of the electric currents respectively flowing in the paths Ip1 and In6 are opposite to each other. The paths Ip2 and Ip3 are located closed to each other; the directions of the electric currents respectively flowing in the paths Ip2 and Ip3 are opposite to each other. The paths Ip4 and In3 are located closed to each other; the directions of the electric currents respectively flowing in the paths Ip4 and In3 are opposite to each other. The paths Ip5 and In2 are located closed to each other; the directions of the electric currents respectively flowing in the paths Ip5 and In2 are opposite to each other. The paths Ip6 and In1 are located closed to each other; the directions of the electric currents respectively flowing in the paths Ip6 and In1 are opposite to each other. The paths In4 and In5 are located closed to each other; the directions of the electric currents respectively flowing in the paths In4 and In5 are opposite to each other.

For each of the above-described pairs of the electric current paths, magnetic fluxes, which are generated around the pair of the electric current paths by the electric currents respectively flowing in the pair of the electric current paths, can be canceled by each other. Consequently, it becomes possible to lower the inductance of each of the electric current paths. As a result, it becomes possible to effectively lower the inductance at the connection portions between the positive and negative busbars 4 and 5 and the semiconductor modules 2.

In the electric power conversion apparatus 1, for each of the semiconductor modules 2, the positive power terminal 24 and the negative power terminal 25 of the semiconductor module 2 are arranged in the X direction to have both the corresponding positive busbar terminal 42 and the corresponding negative busbar terminal 52 interposed therebetween (see FIGS. 1-4).

With the above arrangement, it becomes possible to ensure both electrical insulation between the positive power terminal 24 and the negative power terminal 25 and electrical insulation between the corresponding positive busbar terminal 42 and the corresponding negative busbar terminal 52 with the common insulator 6, more specifically with the same one of the second insulating portions 62 of the insulator 6. Consequently, it becomes possible to minimize the arrangement space of these terminals in the X direction. Moreover, it also becomes possible to effectively perform the process of connecting the semiconductor modules 2 to the positive and negative busbars 4 and 5.

In the electric power conversion apparatus 1, the positive busbar terminals 42 are arranged on the opposite side of the positive busbar base 41 to the semiconductor modules 2 in the Z direction; the negative busbar terminals 52 are arranged on the opposite side of the negative busbar base 51 to the semiconductor modules 2 in the Z direction (see FIGS. 2-3 and 11-12).

With the above arrangement, it becomes possible to minimize the size of the electric power conversion apparatus 1 in the Z direction.

In the electric power conversion apparatus 1, the positive busbar 4 is formed by assembling the metal plates 4a and 4b. The positive busbar base 41 is constituted of the base portions 41a and 41b of the metal plates 4a and 4b which are stacked in the Z direction. Each of the positive busbar terminals 42 is constituted of a portion of only one of the metal plates 4a and 4b, i.e., either one of the terminal portions 42a of the metal plate 4a or one of the terminal portions 42b of the metal plate 4b. For each adjacent pair of the positive busbar terminals 42 in the X direction, one of the adjacent pair of the positive busbar terminals 42 is constituted of one of the terminal portions 42a of the metal plate 4a while the other of the adjacent pair of the positive busbar terminals 42 is constituted of one of the terminal portions 42b of the metal plate 4b (see FIGS. 19 and 21). Similarly, the negative busbar 5 is formed by assembling the metal plates 5a and 5b. The negative busbar base 51 is constituted of the base portions 51a and 51b of the metal plates 5a and 5b which are stacked in the Z direction. Each of the negative busbar terminals 52 is constituted of a portion of only one of the metal plates 5a and 5b, i.e., either one of the terminal portions 52a of the metal plate 5a or one of the terminal portions 52b of the metal plate 5b. For each adjacent pair of the negative busbar terminals 52 in the X direction, one of the adjacent pair of the negative busbar terminals 52 is constituted of one of the terminal portions 52a of the metal plate 5a while the other of the adjacent pair of the negative busbar terminals 52 is constituted of one of the terminal portions 52b of the metal plate 5b (see FIGS. 20-21).

With the above formation of the positive and negative busbars 4 and 5, it becomes possible to minimize the intervals between the positive busbar terminals 42 and the intervals between the negative busbar terminals 52 in the X direction, thereby making it possible to minimize the size of the electric power conversion apparatus 1 in the X direction.

In the electric power conversion apparatus 1, the insulator 6 has the first insulating portion 61, the second insulating portions 62 and the third insulating portions 63 (see FIGS. 23-24). The first insulating portion 61 is interposed between the positive busbar base 41 and the negative busbar base 51 to electrically insulate them from each other. Each of the second insulating portions 62 is interposed between one corresponding pair of the positive busbar terminals 42 and the negative busbar terminals 52 to electrically insulate the corresponding pair of the positive and negative busbar terminals 42 and 52 from each other. Each of the third insulating portions 63 is interposed between one corresponding pair of the positive busbar connection portions 43 and the negative busbar connection portions 53 to electrically insulate the corresponding pair of the positive and negative busbar connection portions 43 and 53 from each other.

With the above configuration, it becomes possible to ensure electrical insulation between the positive and negative busbars 4 and 5 with the single insulator 6. As a result, it becomes possible to reduce the parts count of the electric power conversion apparatus 1, thereby improving the productivity.

In the electric power conversion apparatus 1, for each of the third insulating portions 63 of the insulator 6, there is formed the folded-back portion 64 at the right end of the third insulating portion 63. The folded-back portion 64 is folded back on the opposite side of the third insulating portion 63 to the first insulating portion 61 in the Y direction (see FIGS. 23-24). In the space formed between the folded-back portion 64 and the third insulating portion 63, there is located there is located the right end of a corresponding one of the negative busbar connection portions 53 (see FIGS. 4 and 9).

With the above configuration, it becomes possible to more reliably ensure, for each of the negative busbar connection portions 53, electrical insulation between the negative busbar connection portion 53 and that one of the positive busbar terminals 42 which is located immediately rightward of the negative busbar connection portion 53.

To sum up, according to the present embodiment, it becomes possible to provide the electric power conversion apparatus 1 that has a structure with which it becomes possible to minimize the size of the apparatus 1 in the stacking direction X of the semiconductor modules 2.

Second Embodiment

An electric power conversion apparatus 1 according to a second embodiment has almost the same structure as the electric power conversion apparatus 1 according to the first embodiment. Accordingly, only the differences therebetween will be described hereinafter.

In the first embodiment, for each of the semiconductor modules 2, the positive power terminal 24 and the negative power terminal 25 of the semiconductor module 2 are arranged in the X direction to have both the corresponding positive busbar terminal 42 and the corresponding negative busbar terminal 52 interposed therebetween (see FIGS. 1-4).

Figure 26:
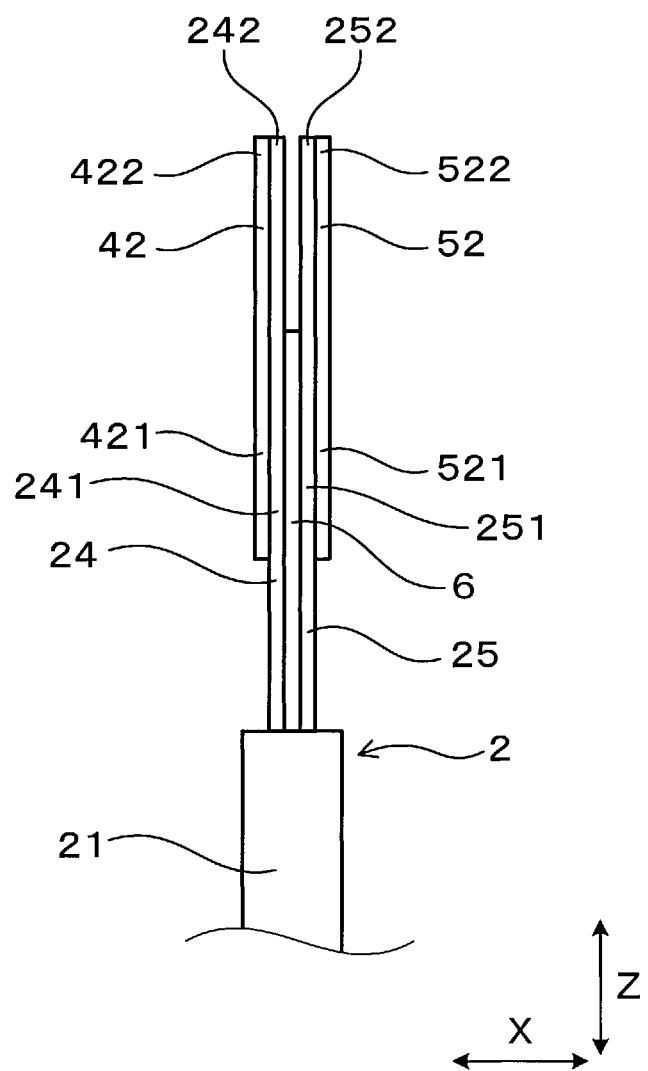
FIG. 26 is an enlarged front view of part of an electric power conversion apparatus according to a second embodiment, wherein a pair of positive and negative power terminals of one of semiconductor modules are connected respectively to positive and negative busbars.
Figure 27:
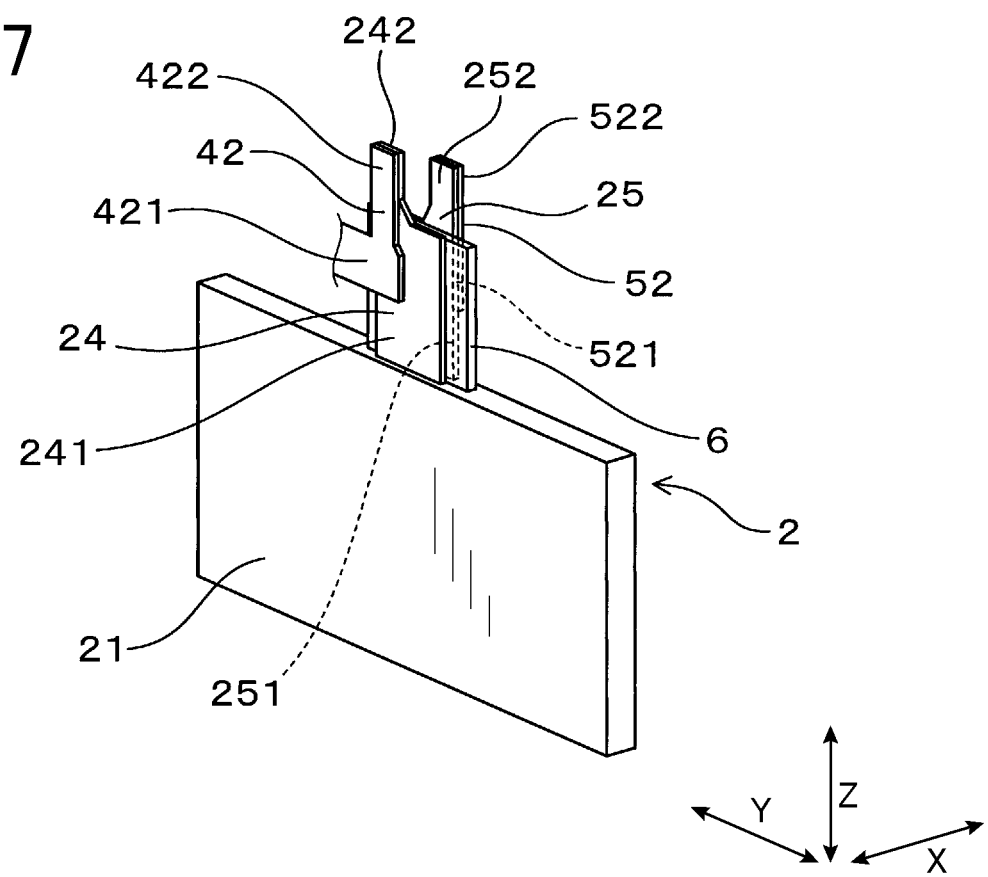
FIG. 27 is a perspective view of the semiconductor module shown in FIG. 26 with the pair of positive and negative power terminals connected respectively to the positive and negative busbars.

In contrast, in the present embodiment, as shown in FIGS. 26-27, for each of the semiconductor modules 2, the positive power terminal 24 and the negative power terminal 25 of the semiconductor module 2 are interposed between a corresponding one of the positive busbar terminals 42 and a corresponding one of the negative busbar terminals 52 in the X direction. In other words, the positive and negative power terminals 24 and 25 of the semiconductor module 2 are opposed to each other in the X direction with the insulator 6 interposed therebetween; the corresponding positive busbar terminal 42 and the corresponding negative busbar terminal 52 are arranged to sandwich the positive and negative power terminals 24 and 25 of the semiconductor module 2 in the X direction. Consequently, the corresponding positive busbar terminal 42 and the corresponding negative busbar terminal 52 respectively face those surfaces of the positive and negative power terminals 24 and 25 of the semiconductor module 2 which are located on the opposite side to the insulator 6.

Moreover, the insulator 6 is interposed between the positive power terminal base portion 241 and the negative power terminal base portion 251 so that when viewed along the X direction, the insulator 6 overlaps both the entire positive power terminal base portion 241 and the entire negative power terminal base portion 251.

Figure 28:
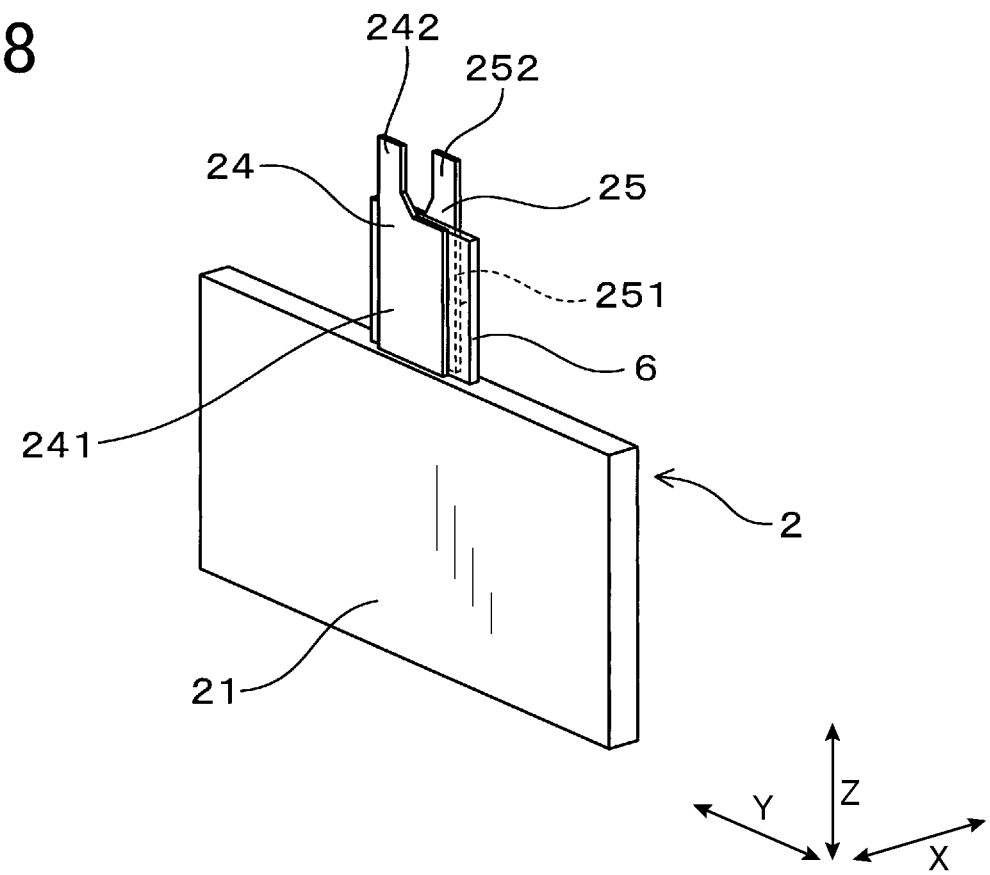
FIG. 28 is a perspective view of the semiconductor module shown in FIG. 26 before the pair of positive and negative power terminals of the semiconductor module are connected respectively to the positive and negative busbars.

As shown FIG. 28, each of the semiconductor modules 2 may have an insulator 6 formed integrally therewith. In this case, the insulator 6 corresponds to one of the second insulating portions 62 of the insulator 6 described in the first embodiment. Moreover, though not shown in the figures, to the positive and negative busbars 4 and 5, there may be assembled another insulator 6 which has portions corresponding to the first insulating portion 61 and third insulating portions 63 of the insulator 6 described in the first embodiment.

With the electric power conversion apparatus 1 according to the present embodiment, it is possible to achieve the same operational effects as achievable with the electric power conversion apparatus 1 according to the first embodiment.

Third Embodiment

An electric power conversion apparatus 1 according to a third embodiment differs from the electric power conversion apparatus 1 according to the first embodiment only in the configuration of the positive and negative busbars 4 and 5.

Figure 29:
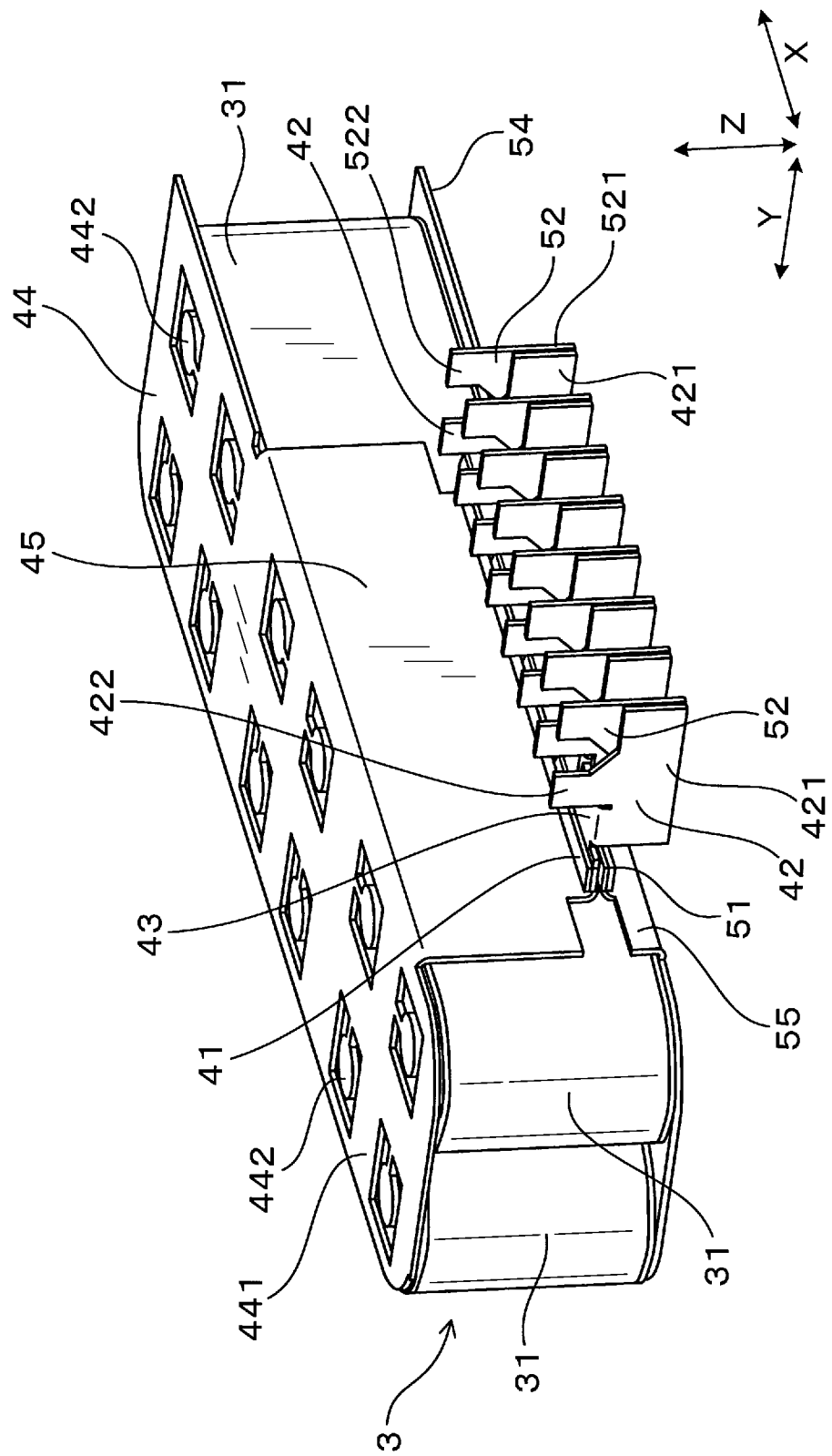
FIG. 29 is a perspective view showing a capacitor and positive and negative busbars of an electric power conversion apparatus according to a third embodiment, omitting the encapsulating resin covering the capacitor.
Figure 30:
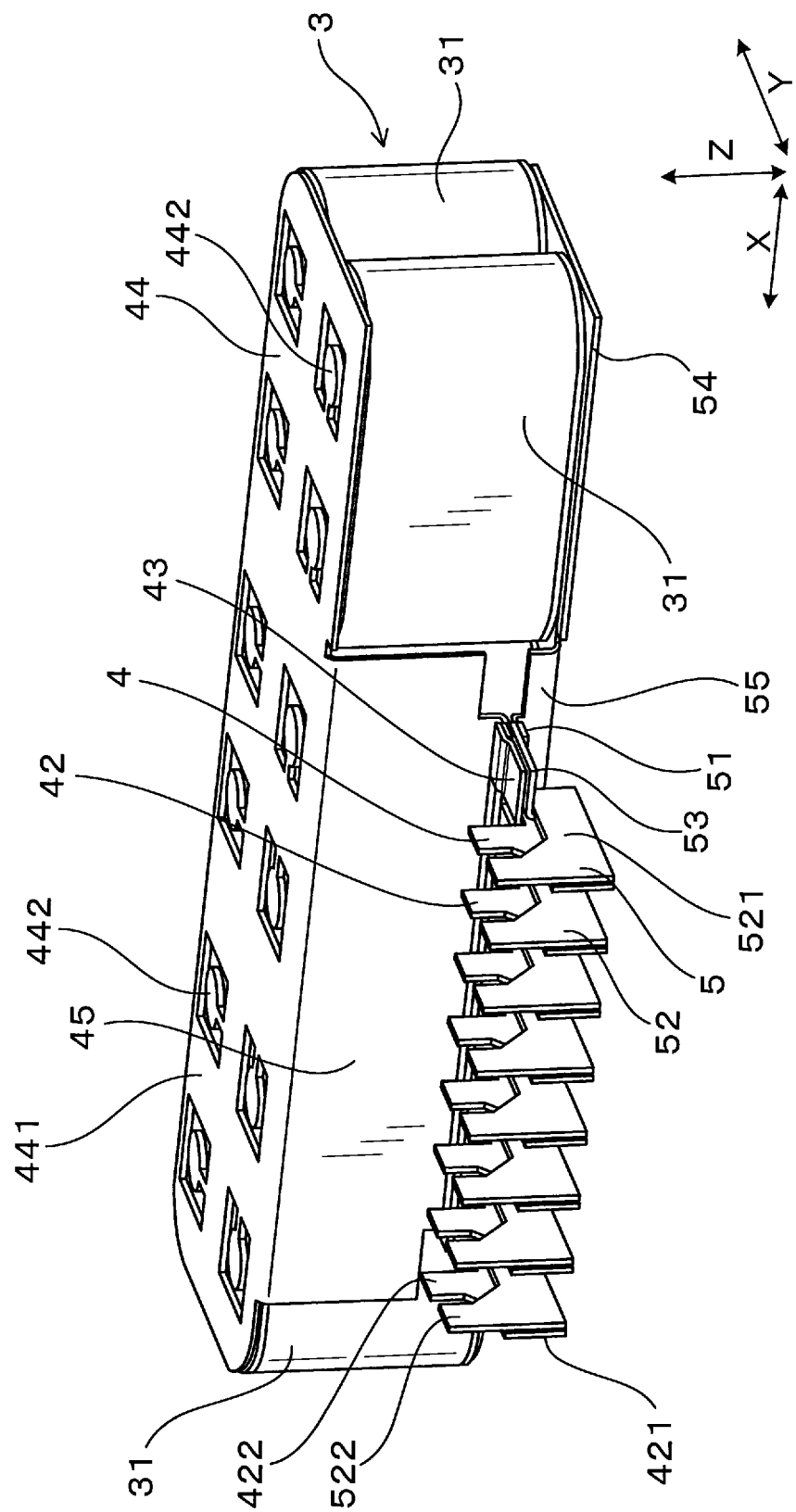
FIG. 30 is another perspective view showing the capacitor and the positive and negative busbars of the electric power conversion apparatus according to the third embodiment, omitting the encapsulating resin covering the capacitor.
Figure 31:
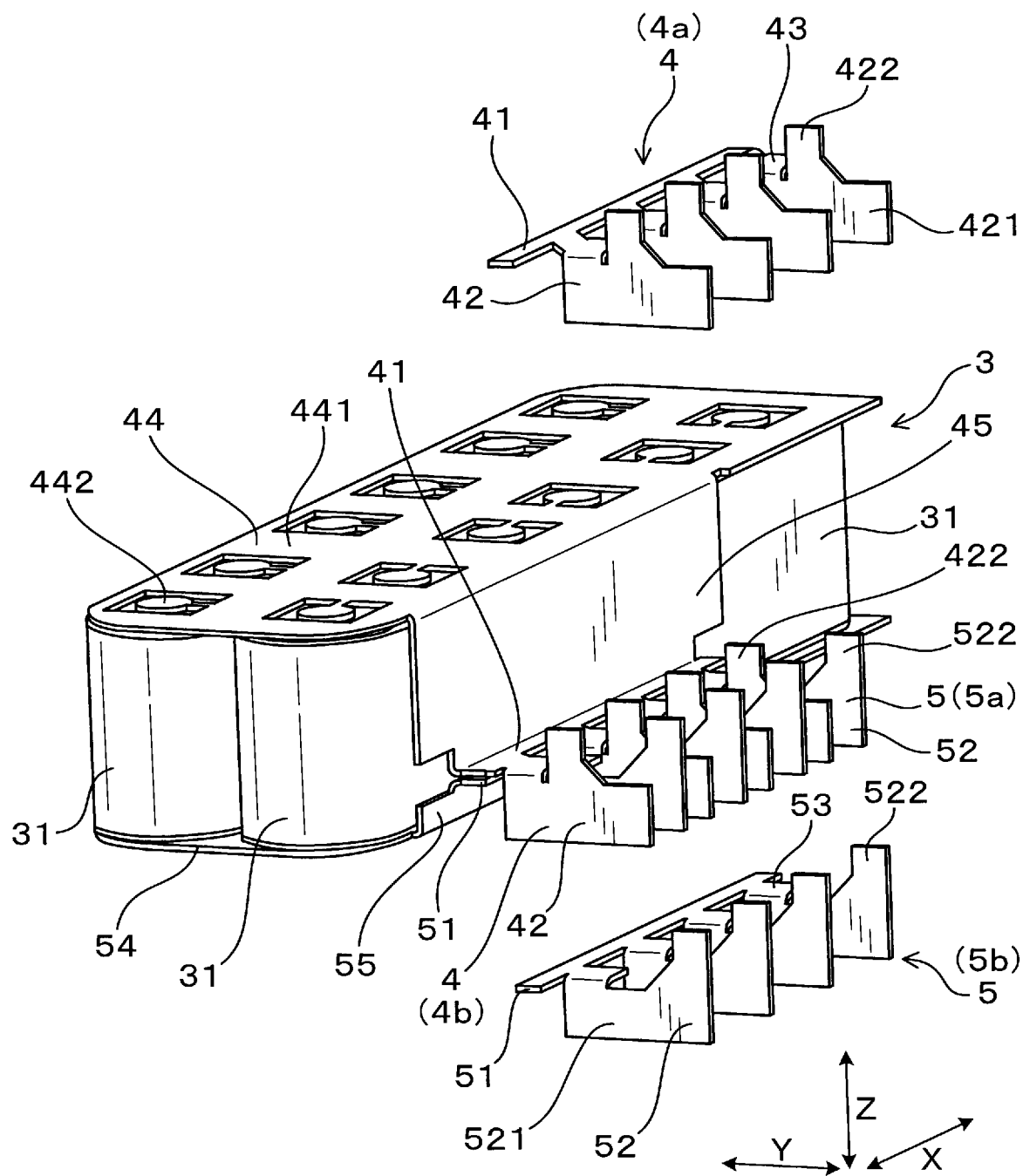
FIG. 31 is an exploded perspective view showing the capacitor and the positive and negative busbars of the electric power conversion apparatus according to the third embodiment, omitting the encapsulating resin covering the capacitor.

In the present embodiment, as shown in FIGS. 29-31, the positive busbar terminal base portions 421 protrude from the positive busbar base 41 downward in the Z direction; in contrast, the positive busbar terminal protruding portions 422 protrude from the positive busbar base 41 upward in the Z direction. Similarly, the negative busbar terminal base portions 521 protrude from the negative busbar base 51 downward in the Z direction; in contrast, the negative busbar terminal protruding portions 522 protrude from the negative busbar base 51 upward in the Z direction.

That is, the positive busbar terminal base portions 421 and the positive busbar terminal protruding portions 422 protrude from the positive busbar base 41 respectively toward opposite sides in the Z direction. Similarly, the negative busbar terminal base portions 521 and the negative busbar terminal protruding portions 522 protrude from the negative busbar base 51 respectively toward opposite sides in the Z direction.

Moreover, the positive busbar connection portions 43, each of which connects between the positive busbar base 41 and a corresponding one of the positive busbar terminals 42, are arranged to have their major surfaces extending perpendicular to the Z direction. Similarly, the negative busbar connection portions 53, each of which connects between the negative busbar base 51 and a corresponding one of the negative busbar terminals 52, are arranged to have their major surfaces extending perpendicular to the Z direction. Moreover, each of the positive busbar connection portions 43 is opposed to a corresponding one of the negative busbar connection portions 53 in the Z direction with the insulator 6 interposed therebetween.

In the present embodiment, the capacitor 3 is configured as described in the first embodiment. However, the negative busbar 5 also includes a front plate part 55 in addition to the lower plate part 54 described in the first embodiment.

That is, in the present embodiment, the negative busbar 5 has the lower plate part 54 arranged on the lower electrode surface of the capacitor 3 (or the lower electrode surfaces of the capacitor elements 31) and the front plate part 55 arranged on the front side surface of the capacitor 3. The negative busbar base 51 protrudes forward from the upper end of the front plate part 55. The front plate part 55 of the negative busbar 5 has a smaller length in the Z direction than the front plate part 45 of the positive busbar 4.

In the present embodiment, as shown in FIG. 31, the positive busbar 4 is formed of two metal plates 4a and 4b, only one of which has both the upper plate part 44 and the front plate part 45 formed as integral parts thereof. Similarly, the negative busbar 5 is formed of two metal plates 5a and 5b, only one of which has both the lower plate part 54 and the front plate part 55 formed as integral parts thereof.

In the present embodiment, all of the upper plate part 44, the front plate part 45, the lower plate part 54 and the front plate part 55 are covered, together with the capacitor elements 31, by encapsulating resin. It should be noted that for the sake of convenience of explanation, the encapsulating resin is omitted from FIGS. 29-31.

Figure 32:
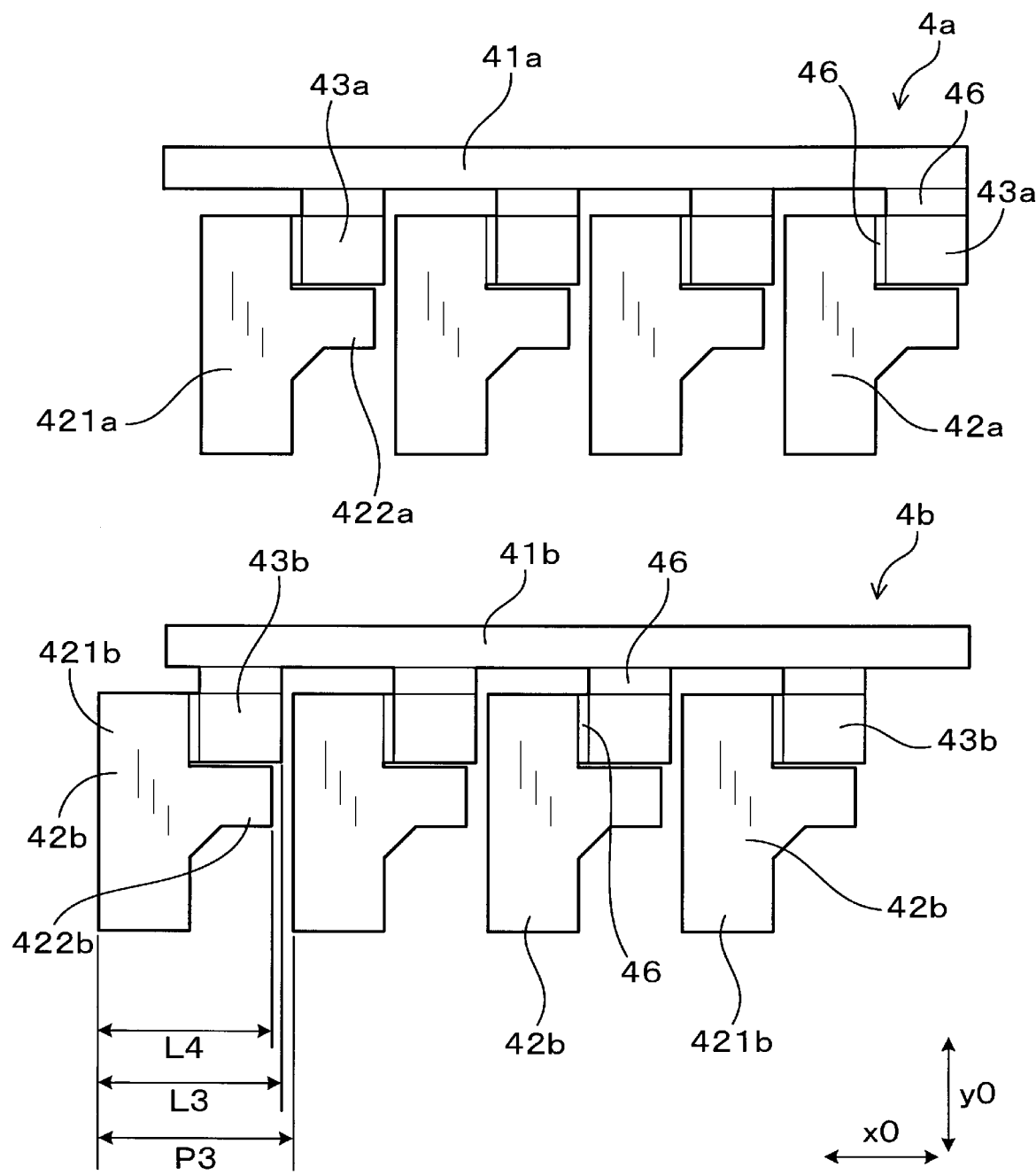
FIG. 32 is a plan view of a pair of metal plates for forming the positive busbar of the electric power conversion apparatus according to the third embodiment.

The two metal plates 4a and 4b forming the positive busbar 4 initially have flat shapes as shown in FIG. 32. That is, the metal plates 4a and 4b initially have flat major surfaces; the initial shapes of the metal plates 4a and 4b viewed along the normal direction z0 to the major surfaces are as shown in FIG. 32. The metal plates 4a and 4b are then bent in a suitable manner to have final shapes as shown in FIG. 31. Thereafter, the metal plates 4a and 4b are assembled together to form the positive busbar 4.

As shown in FIG. 32, before being bent, each of the metal plates 4a and 4b has a base portion 41a or 41b for forming the positive busbar base 41, connection portions 43a or 43b for forming the positive busbar connection portions 43, and terminal portions 42a or 42b for forming the positive busbar terminals 42. Moreover, each of the terminal portions 42a or 42b consists of a terminal base portion 421a or 421b for forming one of the positive busbar terminal base portions 421 and a terminal protruding portion 422a or 422b for forming one of the positive busbar terminal protruding portions 422. In the present embodiment, the terminal protruding portion 422a or 422b protrudes from the terminal base portion 421a or 421b in the x0 direction, not in the y0 direction as in the first embodiment (see FIG. 19).

It should be noted that the definition of the x0 direction, the y0 direction and the z0 direction in the present embodiment is similar to that in the first embodiment.

Moreover, as shown in FIG. 32, in each of the metal plates 4a and 4b, there are provided bending margins 46 between the base portion 41a or 41b and the connection portions 43a or 43b and between the connection portions 43a or 43b and the terminal base portions 421a or 421b.

In the present embodiment, in each of the metal plates 4a and 4b, the length L3 of each connected pair of the connection portions 43a or 43b and the terminal base portions 421a or 421b in the x0 direction is constrained to be less than the formation pitch of the connection portions 43a or 43b, i.e., the formation pitch P3 of the terminal portions 42a or 42b. Moreover, the length L4 of each of the terminal portions 42a or 42*b* in the x0 direction is also constrained to be less than the formation pitch P3 of the terminal portions 42*a* or 42*b*. Therefore, it is necessary to set the formation pitch P3 of the terminal portions 42*a* in the metal plate 4*a* (or the formation pitch P3 of the terminal portions 42*b* in the metal plate 4*b*) to be greater than the sum of the length of each of the positive busbar connection portions 43 in the X direction and the length of each of the positive busbar terminal base portions 421 in the Z direction in the positive busbar 4 or greater than the length of each of the positive busbar terminals 42 in the Z direction in the positive busbar 4. That is, if the positive busbar 4 was formed of only one metal plate 4*a* or 4*b*, it would be necessary to set the formation pitch of the positive busbar terminals 42 to be large. However, in the present embodiment, by forming the positive busbar 4 with the plurality of metal plates 4*a* and 4*b*, it becomes possible to reduce the arrangement pitch of the positive busbar terminals 42 as shown in FIGS. 29-30.

In addition, in the present embodiment, the metal plate 4*b* has both the upper plate part 44 and the front plate part 45 formed as integral parts thereof. However, for the sake of simplicity, both the upper plate part 44 and the front plate part 45 are omitted from FIG. 32.

Figure 33:
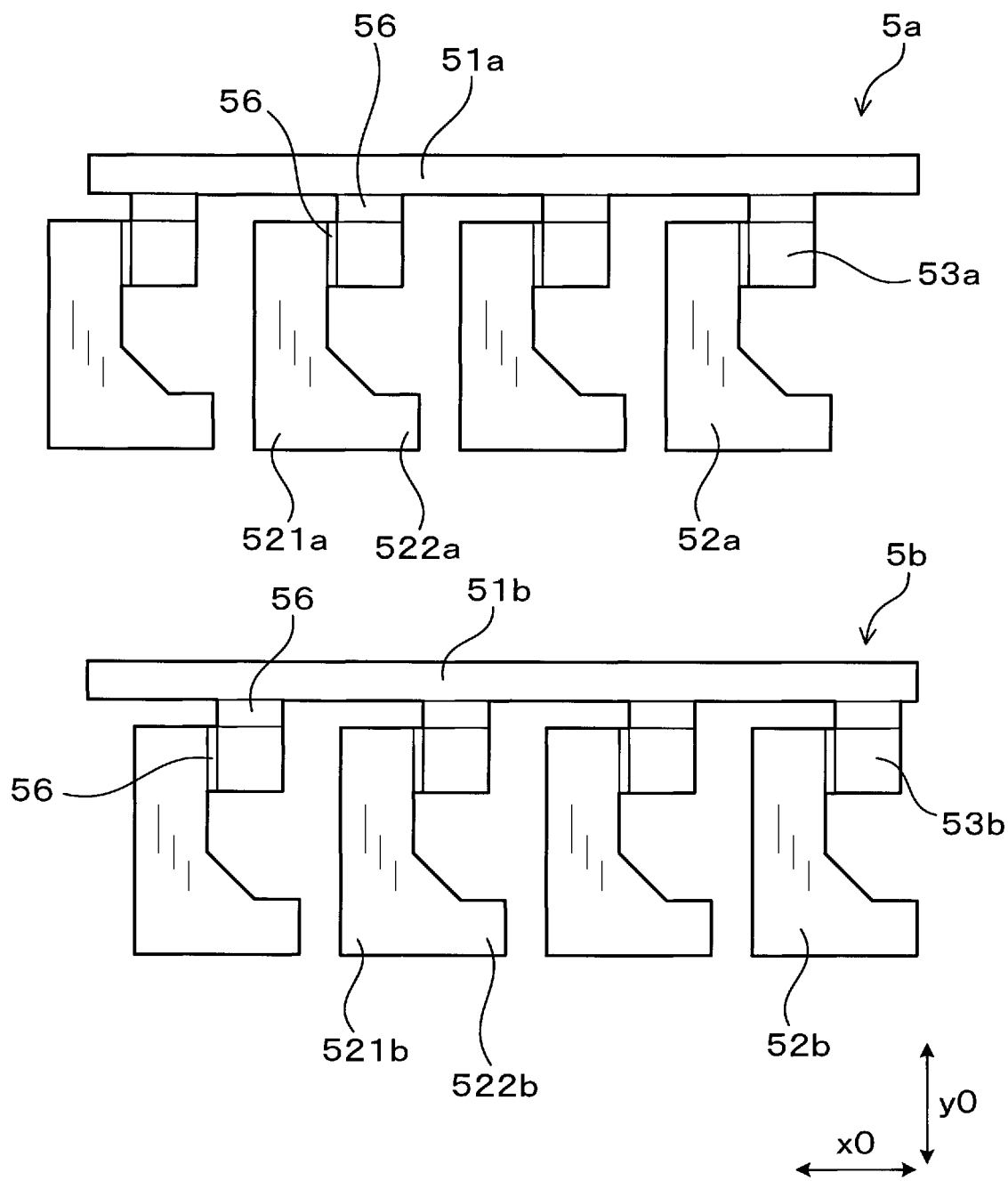
FIG. 33 is a plan view of a pair of metal plates for forming the negative busbar of the electric power conversion apparatus according to the third embodiment.

Similar to the above-described positive busbar 4, the negative busbar 5 is formed of two metal plates 5*a* and 5*b* which initially have flat shapes as shown in FIG. 33. That is, the metal plates 5*a* and 5*b* initially have flat major surfaces; the initial shapes of the metal plates 5*a* and 5*b* viewed along the normal direction z0 to the major surfaces are as shown in FIG. 33. The metal plates 5*a* and 5*b* are then bent in a suitable manner to have final shapes as shown in FIG. 31. Thereafter, the metal plates 5*a* and 5*b* are assembled together to form the negative busbar 5.

As shown in FIG. 33, before being bent, each of the metal plates 5*a* and 5*b* has a base portion 51*a* or 51*b* for forming the negative busbar base 51, connection portions 53*a* or 53*b* for forming the negative busbar connection portions 53, and terminal portions 52*a* or 52*b* for forming the negative busbar terminals 52. Moreover, each of the terminal portions 52*a* or 52*b* consists of a terminal base portion 521*a* or 521*b* for forming one of the negative busbar terminal base portions 521 and a terminal protruding portion 522*a* or 522*b* for forming one of the negative busbar terminal protruding portions 522. In the present embodiment, the terminal protruding portion 522*a* or 522*b* protrudes, from an end part (i.e., a lower end part in FIG. 33) of the terminal base portion 521*a* or 521*b* which is on the opposite side to the base portion 51*a* or 51*b* in the y0 direction, toward the side of the corresponding connection portion 53*a* or 53*b* in the x0 direction (i.e., rightward in FIG. 33).

Moreover, as shown in FIG. 33, in each of the metal plates 5*a* and 5*b*, there are provided bending margins 56 between the base portion 51*a* or 51*b* and the connection portions 53*a* or 53*b* and between the connection portions 53*a* or 53*b* and the terminal base portions 521*a* or 521*b*.

In the metal plate 4*a* for forming the positive busbar 4, the connection portions 43*a* are bent at the bending margins 46 provided between the connection portions 43*a* and the base portion 41*a*, thereby being shifted downward by the thickness of the metal plate 4*a* (see FIG. 31). Moreover, in each of the metal plates 4*a* and 4*b* for forming the positive busbar 4, the terminal portions 42*a* or 42*b* are bent downward at the bending margins 46 provided between the terminal portions 42*a* or 42*b* and the connection portions 43*a* or 43*b*, thereby respectively forming the positive busbar terminals 42. In this way, the positive busbar terminal base portions 421 are located below the positive busbar connection portions 43 while the positive busbar terminal protruding portions 422 are located to protrude upward from the positive busbar connection portions 43 (see FIG. 31).

After being bent as above, the metal plates 4*a* and 4*b* as shown in FIG. 31 are stacked in the Z direction and joined at their respective base portions 41*a* and 41*b*, thereby forming the positive busbar 4. More specifically, the metal plates 4*a* and 4*b* are stacked so that: the base portion 41*a* of the metal plate 4*a* and the base portion 41*b* of the metal plate 4*b* are stacked in the Z direction to together form the positive busbar base 41; the positive busbar terminals 42 formed in the metal plate 4*a* are arranged alternately with the positive busbar terminals 42 formed in the metal plate 4*b* in the X direction; and the intervals between adjacent positive busbar terminals 42 in the X direction are substantially constant.

Similar to the positive busbar 4, the negative busbar 5 is formed by bending, stacking and joining the metal plates 5*a* and 5*b*.

After the formation of the positive and negative busbars 4 and 5, the positive power terminals 24 of the semiconductor modules 2 are respectively connected (or joined) to the positive busbar terminals 42; and the negative power terminals 25 of the semiconductor modules 2 are respectively connected (or joined) to the negative busbar terminals 52.

With the electric power conversion apparatus 1 according to the present embodiment, it is possible to achieve the same operational effects as achievable with the electric power conversion apparatus 1 according to the first embodiment.

While the above particular embodiments have been shown and described, it will be understood by those skilled in the art that various modifications, changes and improvements may be made without departing from the spirit of the present invention.

For example, the connection structure between the semiconductor modules 2 and the positive and negative busbars 4 and 5 according to the second embodiment can be applied to the electric power conversion apparatus 1 according to the third embodiment.

In the first to the third embodiments, the polarities of the busbars 4 and 5 may be interchanged with each other. That is, the busbar 4 may be used as a negative busbar while the busbar 5 is used as a positive busbar. In this case, the reference numeral 41 designates the negative busbar base; the reference numeral 42 designates the negative busbar terminals; the reference numeral 421 designates the negative busbar terminal base portions; the reference numeral 422 designates the negative busbar terminal protruding portions; the reference numeral 43 designates the negative busbar connection portions; the reference numeral 51 designates the positive busbar base; the reference numeral 52 designates the positive busbar terminals; the reference numeral 521 designates the positive busbar terminal base portions; the reference numeral 522 designates the positive busbar terminal protruding portions; the reference numeral 53 designates the positive busbar connection portions; the reference numeral 24 designates the negative power terminals of the semiconductor modules 2; and the reference numeral 25 designates the positive power terminals of the semiconductor modules 2.

What is claimed is:
1. An electric power conversion apparatus comprising:
   at least one semiconductor module having a positive power terminal and a negative power terminal;
   a capacitor;

a pair of positive and negative busbars provided to electrically connect the at least one semiconductor module to the capacitor; and an insulator provided to electrically insulate the positive and negative busbars from each other, wherein:

the positive busbar includes a positive busbar base and at least one positive busbar terminal, the positive busbar base protruding from the capacitor in a busbar base protruding direction and extending in a busbar base extending direction that is perpendicular to the busbar base protruding direction, the at least one positive busbar terminal extending perpendicular to the busbar base extending direction, the negative busbar includes a negative busbar base and at least one negative busbar terminal, the negative busbar base protruding from the capacitor in the busbar base protruding direction and extending in the busbar base extending direction, the at least one negative busbar terminal extending perpendicular to the busbar base extending direction, the positive busbar base and the negative busbar base are arranged to have their major surfaces facing each other in a busbar base facing direction, the busbar base facing direction being perpendicular to both the busbar base protruding direction and the busbar base extending direction, the at least one positive busbar terminal and the at least one negative busbar terminal at least partially overlap each other in the busbar base extending direction with the insulator interposed therebetween, the positive power terminal of the at least one semiconductor module is connected to the at least one positive busbar terminal, the negative power terminal of the at least one semiconductor module is connected to the at least one negative busbar terminal, the at least one semiconductor module comprises a plurality of semiconductor modules that are stacked in the busbar base extending direction and each have a positive power terminal and a negative power terminal, the at least one positive busbar terminal comprises a plurality of positive busbar terminals that each extend perpendicular to the busbar base extending direction and are spaced from one another in the busbar base extending direction, the at least one negative busbar terminal comprises a plurality of negative busbar terminals that each extend perpendicular to the busbar base extending direction and are spaced from one another in the busbar base extending direction, the positive busbar terminals are arranged alternately with the negative busbar terminals in the busbar base extending direction, each of the positive busbar terminals has a positive busbar terminal base portion extending from the positive busbar base in the busbar base protruding direction and a positive busbar terminal protruding portion protruding from the positive busbar terminal base portion in the busbar base facing direction, each of the negative busbar terminals has a negative busbar terminal base portion extending from the negative busbar base in the busbar base protruding direction and a negative busbar terminal protruding portion protruding from the negative busbar terminal base portion in the busbar base facing direction, the positive busbar terminal base portions at least partially overlap the negative busbar terminal base portions in the busbar base extending direction with the insulator interposed therebetween, the positive busbar terminal protruding portions are arranged apart from the negative busbar terminal protruding portions in the busbar base protruding direction so that when viewed along the busbar base extending direction, the positive busbar terminal protruding portions do not overlap the negative busbar terminal protruding portions, each of the positive power terminals of the semiconductor modules is connected to a corresponding one of the positive busbar terminal protruding portions, and each of the negative power terminals of the semiconductor modules is connected to a corresponding one of the negative busbar terminal protruding portions.

2. The electric power conversion apparatus as set forth in claim 1, wherein each of the positive and negative power terminals of the semiconductor modules is plate-shaped and arranged to have its major surfaces extending perpendicular to the busbar base extending direction, for each of the semiconductor modules, the positive power terminal of the semiconductor module has a positive power terminal base portion standing from a main body of the semiconductor module and a positive power terminal protruding portion protruding from the positive power terminal base portion in the busbar base facing direction, and the negative power terminal of the semiconductor module has a negative power terminal base portion standing from the main body of the semiconductor module and a negative power terminal protruding portion protruding from the negative power terminal base portion in the busbar base facing direction, the positive power terminal base portion and the negative power terminal base portion at least partially overlap each other in the busbar base extending direction with the insulator interposed therebetween, the positive power terminal protruding portion and the negative power terminal protruding portion are arranged apart from each other in the busbar base protruding direction so that when viewed along the busbar base extending direction, they do not overlap each other, the positive power terminal protruding portion is connected to the corresponding positive busbar terminal protruding portion and the negative power terminal protruding portion is connected to the corresponding negative busbar terminal protruding portion, and the positive power terminal and the negative power terminal are arranged in the busbar base extending direction to either have both the corresponding positive busbar terminal and the corresponding negative busbar terminal interposed therebetween or be interposed between the corresponding positive busbar terminal and the corresponding negative busbar terminal.

3. The electric power conversion apparatus as set forth in claim 2, wherein the positive power terminal and the negative power terminal are arranged in the busbar base extending direction to have both the corresponding positive busbar terminal and the corresponding negative busbar terminal interposed therebetween.

4. The electric power conversion apparatus as set forth in claim 2, wherein the positive power terminal and the negative power terminal are interposed between the corresponding positive busbar terminal and the corresponding negative busbar terminal in the busbar base extending direction.

5. The electric power conversion apparatus as set forth in claim 1, wherein
the positive busbar terminals are arranged on an opposite side of the positive busbar base to the semiconductor modules in the busbar base facing direction, and the negative busbar terminals are arranged on an opposite side of the negative busbar base to the semiconductor modules in the busbar base facing direction.

6. The electric power conversion apparatus as set forth in claim 1, wherein
the positive busbar is formed of a plurality of first metal plates that are assembled together, the positive busbar base is constituted of portions of the first metal plates which are stacked in the busbar base facing direction, each of the positive busbar terminals is constituted of a portion of only one of the first metal plates, and for each adjacent pair of the positive busbar terminals in the busbar base extending direction, the positive busbar terminals of the adjacent pair are respectively constituted of the portions of different ones of the first metal plates, and
the negative busbar is formed of a plurality of second metal plates that are assembled together, the negative busbar base is constituted of portions of the second metal plates which are stacked in the busbar base facing direction, each of the negative busbar terminals is constituted of a portion of only one of the second metal plates, and for each adjacent pair of the negative busbar terminals in the busbar base extending direction, the negative busbar terminals of the adjacent pair are respectively constituted of the portions of different ones of the second metal plates.

7. The electric power conversion apparatus as set forth in claim 1, wherein
the positive busbar also includes a plurality of positive busbar connection portions each of which connects between the positive busbar base and a corresponding one of the positive busbar terminals,
each of the positive busbar connection portions extends from the positive busbar base in the busbar base facing direction and has its major surfaces extending perpendicular to the busbar base protruding direction,
the negative busbar also includes a plurality of negative busbar connection portions each of which connects between the negative busbar base and a corresponding one of the negative busbar terminals,
each of the negative busbar connection portions extends from the negative busbar base in the busbar base facing direction and has its major surfaces extending perpendicular to the busbar base protruding direction, and
each of the positive busbar connection portions is opposed to a corresponding one of the negative busbar connection portions in the busbar base protruding direction with the insulator interposed therebetween.

8. The electric power conversion apparatus as set forth in claim 7, wherein
the insulator has a first insulating portion, a plurality of second insulating portions and a plurality of third insulating portions,
the first insulating portion is interposed between the positive busbar base and the negative busbar base to electrically insulate them from each other,
each of the second insulating portions is interposed between one corresponding pair of the positive busbar terminals and the negative busbar terminals to electrically insulate the corresponding pair of the positive and negative busbar terminals from each other, and
each of the third insulating portions is interposed between one corresponding pair of the positive busbar connection portions and the negative busbar connection portions to electrically insulate the corresponding pair of the positive and negative busbar connection portions from each other.

9. The electric power conversion apparatus as set forth in claim 8, wherein
for each of the third insulating portions, there is formed a folded-back portion at an end of the third insulating portion on an opposite side in the busbar base extending direction to a corresponding one of the second insulating portions which is directly connected with the third insulating portion, the folded-back portion being folded back on an opposite side of the third insulating portion to the first insulating portion in the busbar base protruding direction, and
in a space formed between the folded-back portion and the third insulating portion, there is located an end of a corresponding one of the positive busbar connection portions or the negative busbar connection portions in the busbar base extending direction.

* * * * *